US011404670B2

(12) United States Patent
Gao et al.

(10) Patent No.: US 11,404,670 B2
(45) Date of Patent: Aug. 2, 2022

(54) LIGHT-EMITTING DEVICE AND METHOD FOR MANUFACTURING SAME, AND DISPLAY DEVICE

(71) Applicant: BOE Technology Group Co., Ltd., Beijing (CN)

(72) Inventors: Hao Gao, Beijing (CN); Tao Wang, Beijing (CN)

(73) Assignee: BOE Technology Group Co., LTD., Beijing (CN)

(*) Notice: Subject to any disclaimer, the term of this patent is extended or adjusted under 35 U.S.C. 154(b) by 140 days.

(21) Appl. No.: 16/960,197

(22) PCT Filed: Feb. 5, 2020

(86) PCT No.: PCT/CN2020/074342
§ 371 (c)(1),
(2) Date: Jul. 6, 2020

(87) PCT Pub. No.: WO2020/186932
PCT Pub. Date: Sep. 24, 2020

(65) Prior Publication Data
US 2021/0217989 A1    Jul. 15, 2021

(30) Foreign Application Priority Data

Mar. 15, 2019 (CN) .......................... 201910197672.9

(51) Int. Cl.
*H01L 51/52* (2006.01)
*H01L 51/56* (2006.01)

(52) U.S. Cl.
CPC ...... *H01L 51/5253* (2013.01); *H01L 51/5271* (2013.01); *H01L 51/56* (2013.01)

(58) Field of Classification Search
CPC ... H01L 51/5253–5256; H01L 51/5271; H01L 51/56
See application file for complete search history.

(56) References Cited

U.S. PATENT DOCUMENTS 8,921,840 B2 * 12/2014 Kim .................. H01L 51/5284
257/40
2004/0113550 A1    6/2004 Adachi et al.
(Continued)

FOREIGN PATENT DOCUMENTS

CN         1508765 A       6/2004
CN       103219354 A       7/2013
(Continued)

OTHER PUBLICATIONS

International search report of PCT application No. PCT/CN2020/074342 dated May 9, 2020.
(Continued)

*Primary Examiner* — Shaun M Campbell
(74) *Attorney, Agent, or Firm* — Fay Sharpe LLP

(57) ABSTRACT

The light-emitting device includes: a base substrate; a light-emitting unit, disposed on the base substrate; and a thin film packaging structure disposed on a side, distal from the base substrate, of the light-emitting unit, wherein the thin film packaging structure includes a target packaging film layer of at least one packaging film layer is provided with a first packaging portion and a second packaging portion which are arranged in the same layer and are in contact with each other, an orthographic projection of the first packaging portion on the base substrate at least partially overlaps an orthographic projection of the light-emitting unit on the base substrate, an orthographic projection of the second packaging portion on the base substrate at least partially overlaps the orthographic projection of the light-emitting unit on the base substrate, and a refractive index of the first packaging portion is less than a refractive index of the second packaging portion.

19 Claims, 15 Drawing Sheets

(56) References Cited

U.S. PATENT DOCUMENTS

| | | |
|---|---|---|
| 2009/0115330 A1 | 5/2009 | Yamauchi |
| 2009/0283807 A1 | 11/2009 | Adkisson et al. |
| 2013/0187163 A1 | 7/2013 | Kim et al. |
| 2013/0313547 A1 | 11/2013 | Nakano et al. |
| 2015/0008403 A1 | 1/2015 | Kudo et al. |
| 2015/0228700 A1* | 8/2015 | Cho .................. H01L 51/5268 257/40 |
| 2016/0087245 A1* | 3/2016 | Park .................. H01L 51/5275 257/40 |
| 2016/0268554 A1 | 9/2016 | Wu et al. |
| 2016/0359142 A1* | 12/2016 | Huangfu ............ H01L 27/3283 |
| 2017/0194400 A1* | 7/2017 | Shim ................. H01L 27/3246 |
| 2017/0294493 A1 | 10/2017 | Yoo et al. |
| 2018/0039117 A1* | 2/2018 | Ikeda ................. G02F 1/1333 |
| 2018/0235038 A1 | 8/2018 | Ho et al. |
| 2018/0301665 A1* | 10/2018 | Sakamoto .............. H01L 51/56 |
| 2020/0266390 A1* | 8/2020 | Jung .................. H01L 51/5275 |
| 2021/0184179 A1* | 6/2021 | Kim .................. H01L 27/3248 |

FOREIGN PATENT DOCUMENTS

| | | |
|---|---|---|
| CN | 103426899 A | 12/2013 |
| CN | 103680335 A | 3/2014 |
| CN | 104282719 A | 1/2015 |
| CN | 104733501 A | 6/2015 |
| CN | 104851903 A | 8/2015 |
| CN | 105977390 A | 9/2016 |
| CN | 107331785 A | 11/2017 |
| CN | 109216584 A | 1/2019 |
| CN | 109904347 A | 6/2019 |

OTHER PUBLICATIONS

First office action of Chinese application No. 201910197672.9 dated Apr. 27, 2020.

* cited by examiner

LIGHT-EMITTING DEVICE AND METHOD FOR MANUFACTURING SAME, AND DISPLAY DEVICE

CROSS-REFERENCE TO RELATED APPLICATION

This application is a 371 of PCT Application No. PCT/CN2020/074342, filed on Feb. 5, 2020 which claims priority to Chinese Patent Application No. 201910197672.9, filed on Friday, Mar. 15, 2019 and entitled "LIGHT-EMITTING DEVICE AND METHOD FOR MANUFACTURING SAME, AND DISPLAY DEVICE", the entire contents of which are incorporated herein by reference.

TECHNICAL FIELD

The present disclosure relates to a light-emitting device and a method for manufacturing the same, and a display device.

BACKGROUND

The organic light-emitting diode (OLED) device is an electroluminescent device, which has the advantages of low power consumption, self-luminescence, fast response, wide viewing angle, flexible display, and the like, and is a research hotspot in the current display industry.

SUMMARY

The present disclosure provides a light-emitting device and a method for manufacturing the same, and a display device. The technical solutions are as follows:

In one aspect, a light-emitting device is provided. The light-emitting device includes:

a base substrate;

a light-emitting unit disposed on the base substrate; and a thin film packaging structure disposed on a side of the light-emitting unit distal from the base substrate;

wherein the thin film packaging structure includes at least one packaging film layer, and a target packaging film layer of the at least one packaging film layer includes a first packaging portion and a second packaging portion; wherein the first packaging portion and the second packaging portion are arranged in the same layer and are in contact with each other, an orthographic projection of the first packaging portion on the base substrate at least partially overlaps an orthographic projection of the light-emitting unit on the base substrate, an orthographic projection of the second packaging portion on the base substrate at least partially does not overlap the orthographic projection of the light-emitting unit, a refractive index of the first packaging portion is less than a refractive index of the second packaging portion, and the target packaging film layer is configured to enable light emitted by the light-emitting unit to leave from a light emitting surface of the light-emitting device by refraction Optionally, the target packaging film layer is a packaging film layer, most proximal to the light-emitting unit, of the at least one packaging film layer.

Optionally, the target packaging film layer is an inorganic layer.

Optionally, a difference between the refractive index of the second packaging portion and the refractive index of the first packaging portion is in a range of about 0.1 to 0.5.

Optionally, the refractive index of the first packaging portion is in a range of about 1.45 to 1.55, and the refractive index of the second packaging portion is in a range of about 1.65 to 1.85.

Optionally, a material of the first packaging portion includes silicon oxide, and a material of the second packaging portion includes silicon oxynitride.

Optionally, the thin film packaging structure includes inorganic layers and organic layers which are alternately superimposed along a direction going distally from the light-emitting unit; and in the thin film packaging structure, a packaging film layer most proximal to the light-emitting unit and a packaging film layer most distal from the light-emitting unit are the inorganic layers, and the target packaging film layer is the inorganic layer most proximal to the light-emitting unit.

Optionally, a first horizontal distance between a boundary of the first packaging portion and a boundary of the second packaging portion is in a range of about 2 microns to 6 microns, wherein the first horizontal distance is a minimum distance between the boundary of the first packaging portion and the boundary of the second packaging portion in a direction parallel to a substrate surface of the base substrate.

Optionally, the base substrate is provided with a packaging region, the orthographic projection of the light-emitting unit on the base substrate falls within the packaging region, the orthographic projection of the first packaging portion on the base substrate completely covers an orthographic projection of the light-emitting unit on the base substrate, and the orthographic projection of the second packaging portion on the base substrate covers a region in the packaging region other than a region where the orthographic projection of the first packaging portion on the base substrate is disposed.

Optionally, the light-emitting device further includes: a reflective layer being arranged to surround the light-emitting unit, an included angle being defined between a reflective surface of the reflective layer and a substrate surface of the base substrate.

Optionally, the base substrate is provided with a packaging region, an orthographic projection of the light-emitting unit on the base substrate and an orthographic projection of the reflective layer on the base substrate fall within the packaging region, the orthographic projection of the first packaging portion on the base substrate completely covers the orthographic projection of the light-emitting unit on the base substrate and completely covers the orthographic projection of the reflective layer on the base substrate, and the orthographic projection of the second packaging portion on the base substrate covers a region in the packaging region other than a region where the orthographic projection of the first packaging portion on the base is disposed.

Optionally, a second horizontal distance between a boundary of the first packaging portion and a boundary of the reflective surface of the reflective layer is in a range of about 1 microns to 4 microns, wherein the second horizontal distance is the minimum distance between the boundary of the first packaging portion and the boundary of the reflective surface of the reflective layer in a direction parallel to a substrate surface of the base substrate.

Optionally, the light-emitting unit includes a first electrode, a light-emitting layer and a second electrode which are sequentially superimposed in a direction going distally from the base substrate, wherein the reflective layer is arranged to surround the first electrode.

Optionally, the light-emitting device further includes: a planarization layer, wherein the planarization layer is provided with a groove, and the reflective layer is arranged on a side wall of the groove.

Optionally, the light-emitting device further includes: a defining layer, wherein the defining layer is provided with a light-emitting opening, and the light-emitting unit is disposed in the light-emitting opening.

In another aspect, a method for manufacturing a light-emitting device is provided. The method includes:

providing a base substrate;

forming a light-emitting unit on the base substrate; and a thin film packaging structure is formed on a side, distal from the base substrate, of the light-emitting unit, wherein the thin film packaging structure includes at least one packaging film layer, and a target packaging film layer of the at least one packaging film layer includes a first packaging portion and a second packaging portion; wherein the first packaging portion and the second packaging portion are arranged in the same layer and are in contact with each other, an orthographic projection of the first packaging portion on the base substrate at least partially overlaps an orthographic projection of the light-emitting unit on the base substrate, an orthographic projection of the second packaging portion on the base substrate at least partially does not overlap the orthographic projection of the light-emitting unit on the base substrate, a refractive index of the first packaging portion is less than a refractive index of the second packaging portion, and the target packaging film layer is configured to enable light emitted by the light-emitting unit to leave from a light emitting surface of the light-emitting device by refraction.

Optionally, forming the thin film packaging structure on the side, distal from the base substrate, of the light-emitting unit includes:

forming a first packaging portion on the side, distal from the base substrate, of the light-emitting unit;

forming a second packaging portion on the side, distal from the base substrate, of the light-emitting unit, wherein the first packaging portion and the second packaging portion form the target packaging layer; and forming an organic layer on a side, distal from the light-emitting unit, of the target packaging film layer.

Optionally, the method further includes: forming a reflective layer surrounding the light-emitting unit, wherein an included angle is defined between a reflective surface of the reflective layer and a substrate surface of the base substrate.

Optionally, forming the light-emitting unit on the base substrate includes:

forming a first electrode, a light-emitting unit, and a second electrode which are sequentially superimposed on the base substrate.

forming the reflective layer surrounding the light-emitting unit includes:

forming a reflective layer surrounding the first electrode.

Optionally, the reflective layer and the first electrode are formed simultaneously.

Optionally, before forming the reflective layer surrounding the first electrode, the method further includes:

forming a planarization layer on the base substrate, wherein the planarization layer is provided with a groove.

forming the reflective layer surrounding the first electrode includes:

forming the reflective layer surrounding the first electrode on a side wall of the groove.

Optionally, the method further includes: forming a defining layer, wherein the defining layer is provided with a light-emitting opening, and the light-emitting unit is disposed in the light-emitting opening.

In still another aspect, a display device is provided. The display device includes, the light-emitting device as described above.

BRIEF DESCRIPTION OF THE ACCOMPANYING DRAWINGS

For clearer description of the technical solutions according to the embodiments of the present disclosure, the accompanying drawings for describing the embodiments are introduced briefly hereinafter. Apparently, the accompanying drawings in the following description are only about some embodiments of the present disclosure, and persons of ordinary skill in the art may derive other drawings from these accompanying drawings without creative efforts.

The accompanying drawings, which are incorporated in and constitute a part of this specification, illustrate embodiments consistent with the present disclosure and, together with the description, serve to explain the principles of the present disclosure.

DETAILED DESCRIPTION

For clearer descriptions of the principles, technical solutions and advantages of the present disclosure, the present disclosure will be clearly and completely described hereafter in connection with the drawings. It is apparent that the described embodiments are a part of the embodiments of the present disclosure, but not the whole. Based on the embodiments of the present disclosure, all the other embodiments obtained by that of ordinary skill in the art without inventive effort are within the scope of the present disclosure.

The OLED device, which is the research hotspot in the current display industry, generally includes a light-emitting unit and a thin film packaging structure for encapsulating the light-emitting unit. The thin film packaging structure may ensure the flexibility of the OLED device while prolonging the service life of the OLED device.

The out-coupling efficiency of the OLED device is a hotspot and a difficult point in research. The out-coupling efficiency, also known as light emission efficiency, refers to a ratio of a power of light emitted theoretically to a power of light actually detected. When the OLED device operates, light emitted by the light-emitting unit is emitted out by the thin film packaging structure. However, in light emitted into the thin film packaging structure from the light-emitting unit, light with an angle of incidence within a certain range may exert a waveguide effect in the thin film packaging structure to be consumed, such that light emitted from the thin film packaging structure is weakened and the out-coupling efficiency of the OLED device is low.

Figure 1:
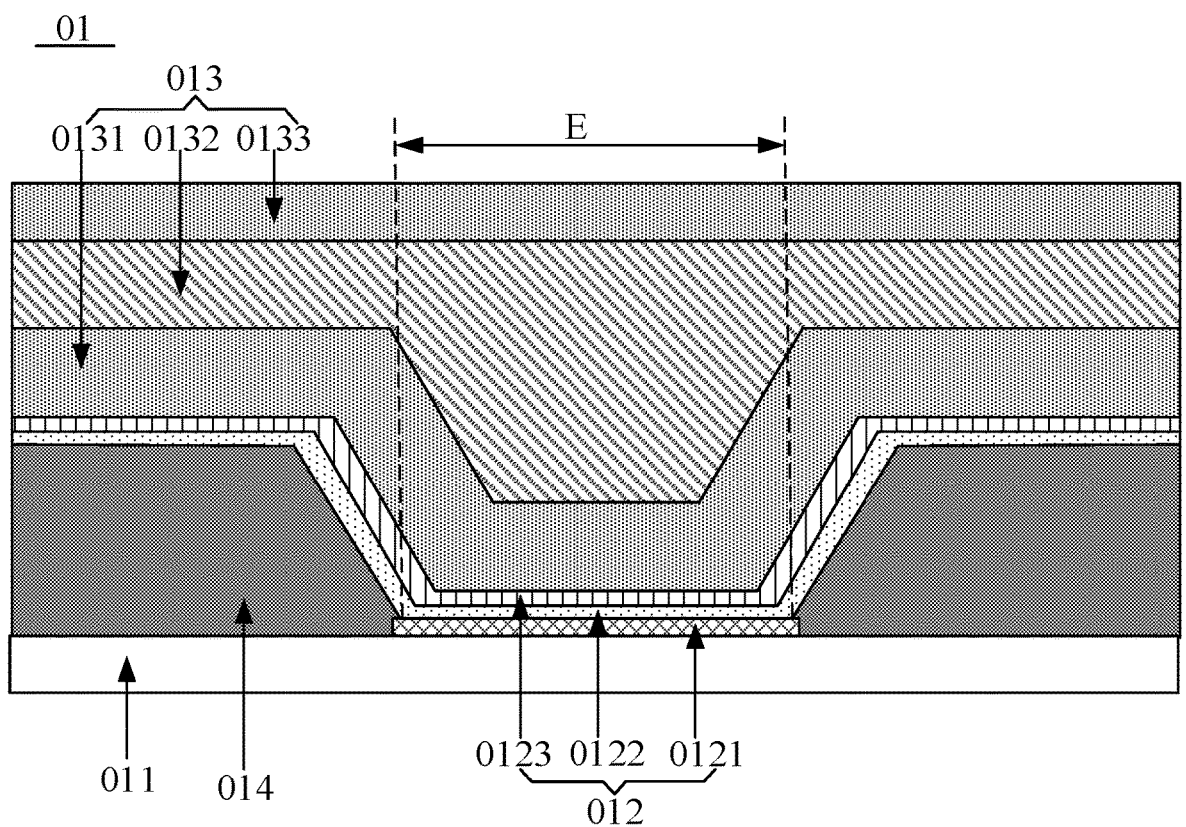
FIG. 1 is a schematic structural diagram of an OLED device according to an embodiment of the present disclosure.
Figure 2:
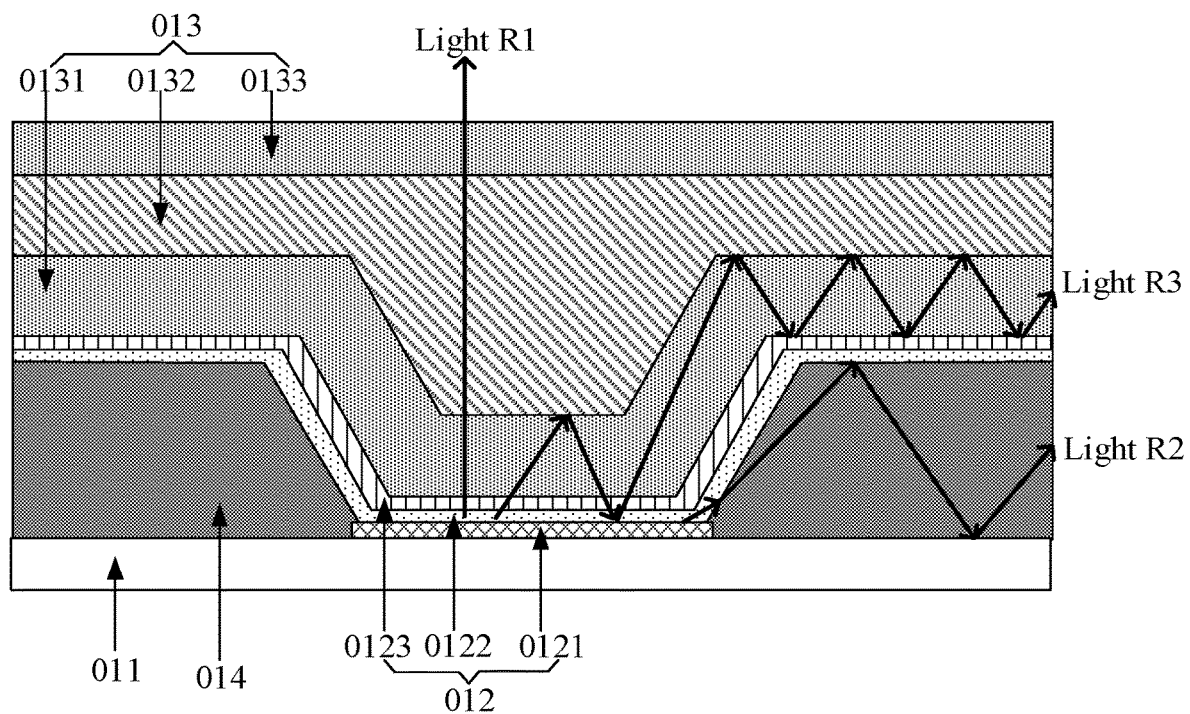
FIG. 2 is a schematic diagram of light propagated in the light-emitting device shown in FIG. 1.

A top-emitting OLED device is a typical OLED device, and the waveguide effect is one of the main factors affecting the out-coupling efficiency of the top-emitting OLED device. The thin film packaging structure intensifies the waveguide effect of the top-emitting OLED device, thereby enabling the out-coupling efficiency of the top-emitting OLED device to be lower. For example, referring to FIG. 1 which shows a schematic structural diagram of an OLED device 01 according to an embodiment of the present disclosure, the OLED device 01 may be a top-emitting OLED device. Referring to FIG. 1, the OLED device 01 includes a base substrate 011, a light-emitting unit 012 disposed on the base substrate 011, a thin film packaging structure 013 disposed on a side, distal from the base substrate 011, of the light-emitting unit 012, and a defining layer 014 disposed on the base substrate 011. The defining layer 014 is provided with a light-emitting opening E. The light-emitting unit 012 is disposed in the light-emitting opening E of the defining layer 014. The light-emitting unit 012 includes an anode 0121, a light-emitting layer 0122, and a cathode 0123 which are sequentially superimposed in a direction distal from the base substrate 011 (that is, the light-emitting unit 012 is formed by the anode 0121, the light-emitting layer 0122, and the cathode 0123 which are disposed in the light-emitting opening E and are superimposed). The thin film packaging structure 013 includes an inorganic layer 0131, an organic layer 0132, and an inorganic layer 0133 which are sequentially superimposed in a direction going distally from the light-emitting unit 012. FIG. 2 shows a schematic diagram of light propagated in the OLED device 01 shown in FIG. 1. Referring to FIG. 2, the light-emitting layer 0122 emits light under the action of the anode 0121 and the cathode 0123. In light emitted by the light-emitting layer 0122, light R1 directly passes through the thin film packaging structure 013 and is emitted from a light emitting surface (that is a side, distal from the base substrate 011, of the inorganic layer 0133) of the OLED device 01; after being emitted into the defining layer 014, light R2 exert a waveguide effect in the defining layer 014 to be propagated transversely and is finally consumed by the defining layer 014; and after being emitted into the thin film packaging structure 013, light R3 exerts a waveguide effect in the thin film packaging structure 013 (such as the inorganic layer 013) to be propagated transversely and is finally consumed by the thin film packaging structure 013. In the light emitted by the light-emitting layer 0122, only the light R1 is emitted from the light emitting surface of the OLED device 01, and the light R2 and the light R3 are consumed by the OLED device 01; therefore, in the light emitted by the light-emitting layer 0122, most of light is consumed in the OLED device 01, only a small amount of light is emitted from the light emitting surface of the OLED device 01, and the emission efficiency of the OLED device 01 is low.

Figure 3:
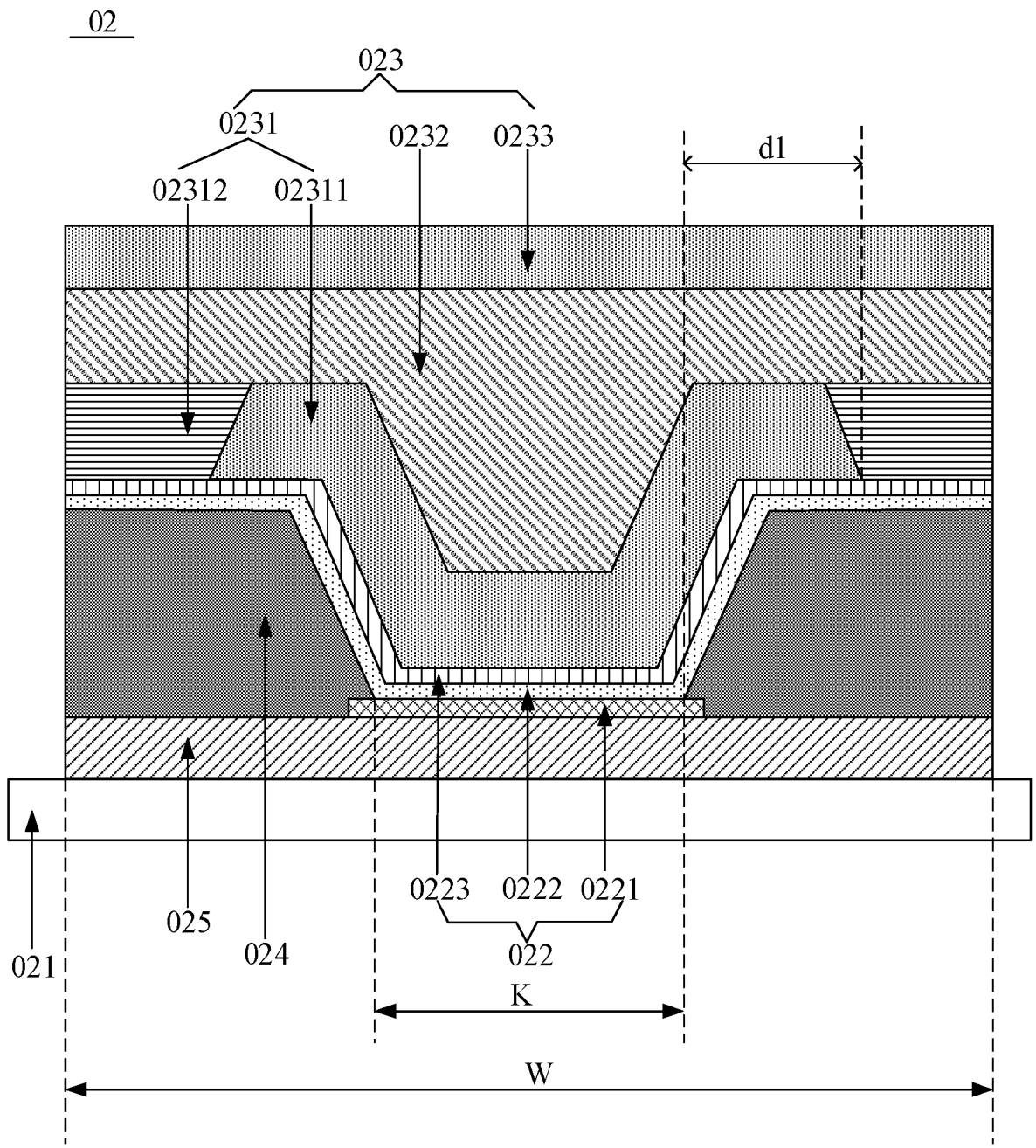
FIG. 3 is a schematic structural diagram of a light-emitting device according to an embodiment of the present disclosure.

Referring to FIG. 3 which shows a schematic structural diagram of a light-emitting device 02 according to an embodiment of the present disclosure, the light-emitting device 02 includes: a base substrate 021; a light-emitting unit 022, disposed on the base substrate 021; and a thin film packaging structure 023, disposed on a side, distal from the base substrate 021, of the light-emitting unit 022. The thin film packaging structure 023 includes at least one packaging film layer. A target packaging film layer of the at least one packaging film layer is provided with a first packaging portion 02311 and a second packaging portion 02312 which are arranged in the same layer and are in contact with each other. An orthographic projection of the first packaging portion 02311 on the base substrate 021 at least partially overlaps an orthographic projection of the light-emitting unit 022 on the base substrate 021. An orthographic projection of the second packaging portion 02312 on the base substrate 021 at least partially does not overlap the orthographic projection of the light-emitting unit 022. A refractive index of the first packaging portion 02311 is less than a refractive index of the second packaging portion 02312. The target packaging film layer 0231 is configured to enable the light emitted by the light-emitting unit 022 to be emitted from the light emitting surface of the light-emitting device 02 by refraction. The light emitting surface of the light-emitting device 02 is a surface, distal from the base substrate 021, of the thin film packaging structure 023.

Figure 4:
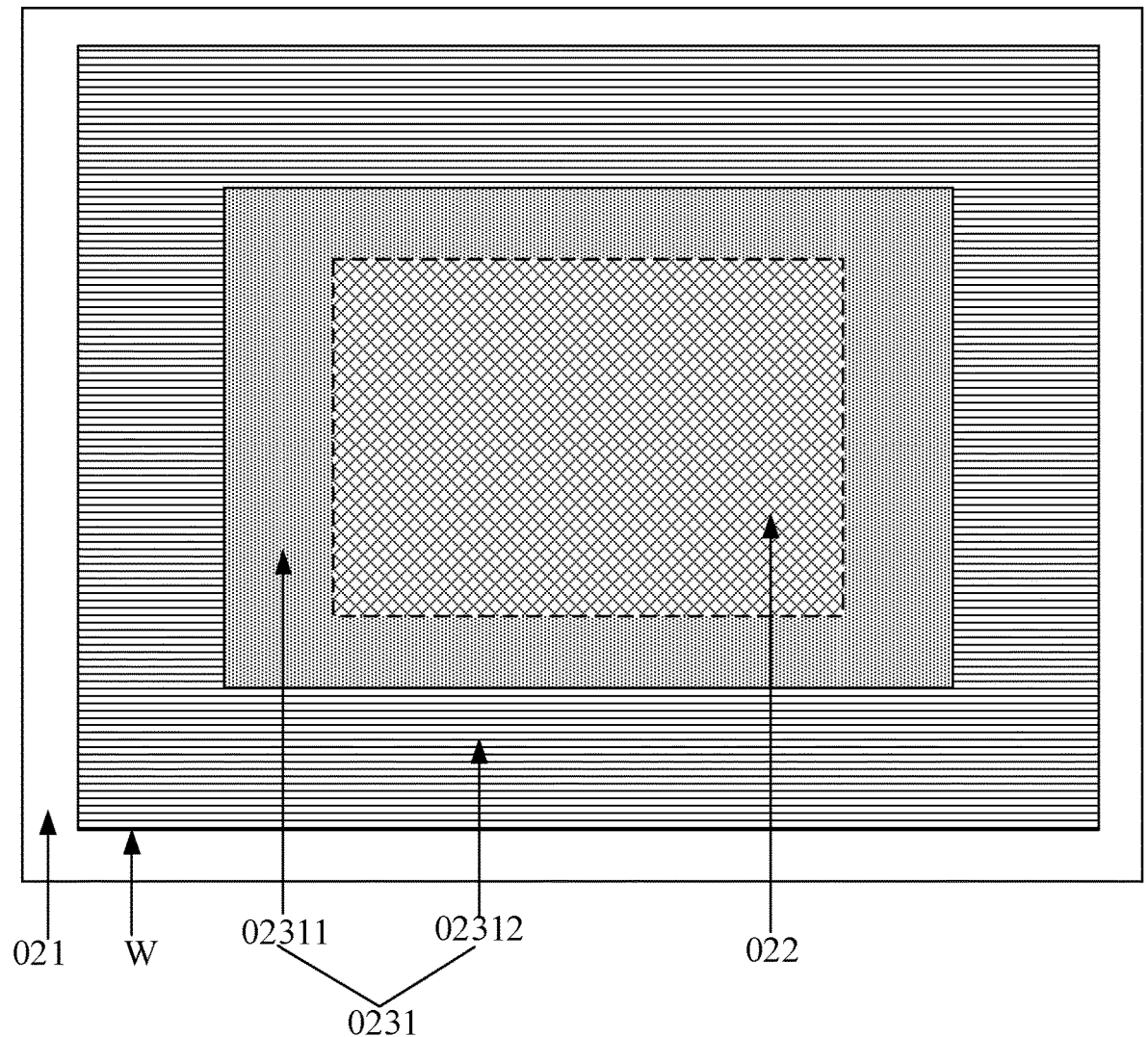
FIG. 4 is a top view of the light-emitting device shown in FIG. 3.

Optionally, FIG. 4 is a top view of the light-emitting device 02 shown in FIG. 3. Referring to FIG. 4 and FIG. 3, an orthographic projection of the first packaging portion 02311 on the base substrate 021 completely covers an orthographic projection of the light-emitting unit 022 on the base substrate 021, and an orthographic projection of the second packaging portion 02312 on the base substrate 021 does not overlap an orthographic projection of the light-emitting unit 022 on the base substrate 021. For clear illustration of a projection relationship between the light-emitting unit 022 and the first packaging portion 02311 and a projection relationship between the light-emitting unit 022 and the second packaging portion 02312, FIG. 4 does not show other structures of the thin film packaging structure 023, and in FIG. 4, a boundary of the light-emitting unit 022 is drawn by dotted lines, which indicates that the light-emitting unit 022 is disposed below the first packaging portion 02311 and is completed covered with the first packaging portion 02311.

In conclusion, in the light-emitting device according to the embodiment of the present disclosure, a target packaging film layer of the thin film packaging structure is provided with a first packaging portion and a second packaging portion which are arranged in the same layer and are in contact with each other, an orthographic projection of the first packaging portion on the base substrate at least partially overlaps an orthographic projection of the light-emitting unit on the base substrate, an orthographic projection of the second packaging portion on the base substrate at least partially does not overlap the orthographic projection of the light-emitting unit, and a refractive index of the first packaging portion is less than a refractive index of the second packaging portion. After being emitted into the target packaging film layer, the light emitted by the light-emitting unit is firstly propagated in the first packaging portion, then is refracted to the second packaging portion from an interface of the first packaging portion and the second packaging portion to a side where the light emitting surface of the light-emitting device is disposed, and finally passes through the second packaging portion and is emitted from the light emitting surface of the light-emitting device. Therefore, the target packaging film layer may be emitted from the light emitting surface of the light-emitting device by refraction, which contributes to preventing light from generating waveguide effect in the thin film packaging structure and improving the emission efficiency of the light-emitting device.

Optionally, as shown in FIG. 3, the light-emitting unit 022 includes a first electrode 0221, a light-emitting layer 0222, and a second electrode 0223 which are sequentially superimposed in a direction going distally from the base substrate 021. The light-emitting device 02 further includes a defining layer 024 and a planarization layer 025. The planarization layer 025 is a film layer with a flat surface (that is a surface, distal from the base substrate 021, of the planarization layer 025). The defining layer 024 is provided with a light-emitting opening K. Parts, which are sequentially superimposed and are in contact with each other, of the first electrode 0221, the light-emitting layer 0222, and the second electrode 0223 are disposed in the light-emitting opening K of the defining layer 024. Since the light-emitting unit 022 is formed by the parts, which are sequentially superimposed and are in contact with each other, of the first electrode 0221, the light-emitting layer 0222, and the second electrode 0223, the light-emitting unit 022 is disposed in the light-emitting opening K. The light-emitting device 02 shown in FIG. 3 may be a top-emitting light-emitting device.

Optionally, as shown in FIG. 3, a first horizontal distance between a boundary of the first packaging portion 02311 and a boundary of the light-emitting unit 022 is d1, and the first horizontal distance d1 is in a range of about 2 microns to 6 microns, thereby reducing a precision requirement on a preparation process of the first packaging portion 02311 while ensuring the orthographic projection of the first packaging portion 02311 on the base substrate 021 to completely cover the orthographic projection of the light-emitting unit 022 on the base substrate 021 to facilitate preparation of the first packaging portion 02311. In the embodiment of the present disclosure, the first horizontal distance d1 being in a range of about 2 microns to 6 microns may mean that the range of the first horizontal distance d1 may fluctuate 20% left and right on the basis of the range of 2 microns to 6 microns; and optionally, the first horizontal distance d1 may be in a range of (2±2×20%) microns to (6±6×20%) microns, that is, the first horizontal distance d1 may be in a range of (2±0.4) microns to (6±1.2) microns. For example, the first horizontal distance d1 may be in a range of 1.6 microns to 4.8 microns, or the first horizontal distance d1 may be in a range of 2.4 microns to 7.2 microns, or the first horizontal distance d1 may be in a range of 1.6 microns to 7.2 microns, or the first horizontal distance d1 may be in a range of 2.4 microns to 4.8 microns. For example, d1=2 microns, d1=3 microns, d1=4 microns, or the like. The first horizontal distance d1 may be a minimum distance between the boundary of the first packaging portion 02311 and the boundary of the light-emitting unit 022 in a direction parallel to a substrate surface of the base substrate 021. As shown in FIG. 3, a boundary of the light-emitting unit 022 may be a boundary of the light-emitting opening of the defining layer 024.

Optionally, as shown in FIG. 3 and FIG. 4, the base substrate 021 is provided with a packaging region W, an orthographic projection of the light-emitting unit 022 on the base substrate 021 falls within the packaging region W, an orthographic projection of the first packaging portion 02311 on the base substrate 021 completely covers an orthographic projection of the light-emitting unit 022 on the base substrate 021, and an orthographic projection of the second packaging portion 02312 on the base substrate 021 covers a region in the packaging region W other than a region where the orthographic projection of the first packaging portion 02311 on the base substrate 021 is disposed, that is, an orthographic projection of the target packaging film layer 0231 on the base substrate 021 completely covers the packaging region W. Therefore, the target packaging film layer 0231 is formed by the adjacent first packaging portion 02311 and second packaging portion 02312, that is, the boundary of the first packaging portion 02311 is a junction of the first packaging portion 02311 and the second packaging portion 02312.

Figure 5:
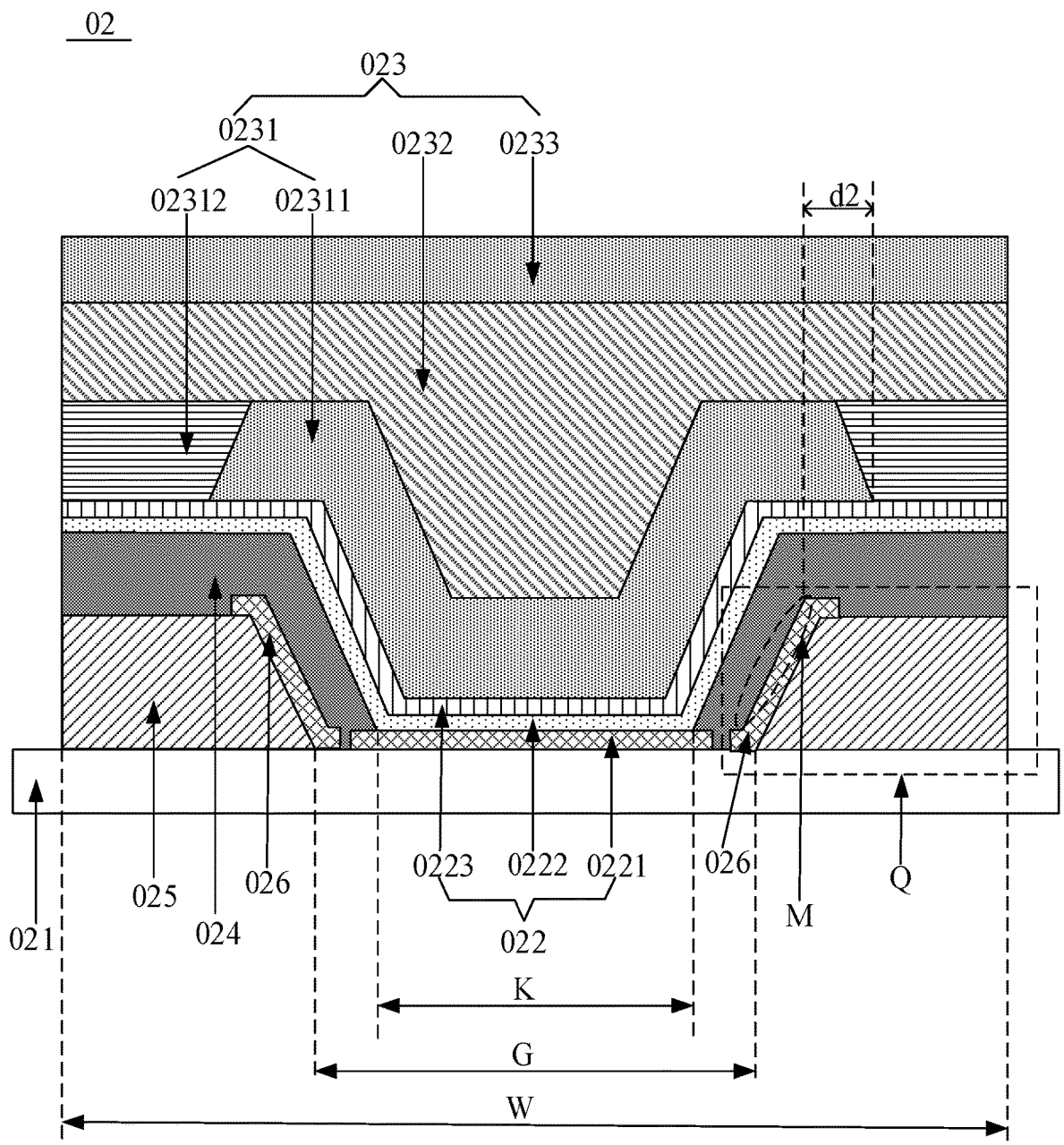
FIG. 5 is a schematic structural diagram of another light-emitting device according to an embodiment of the present disclosure.
Figure 6:
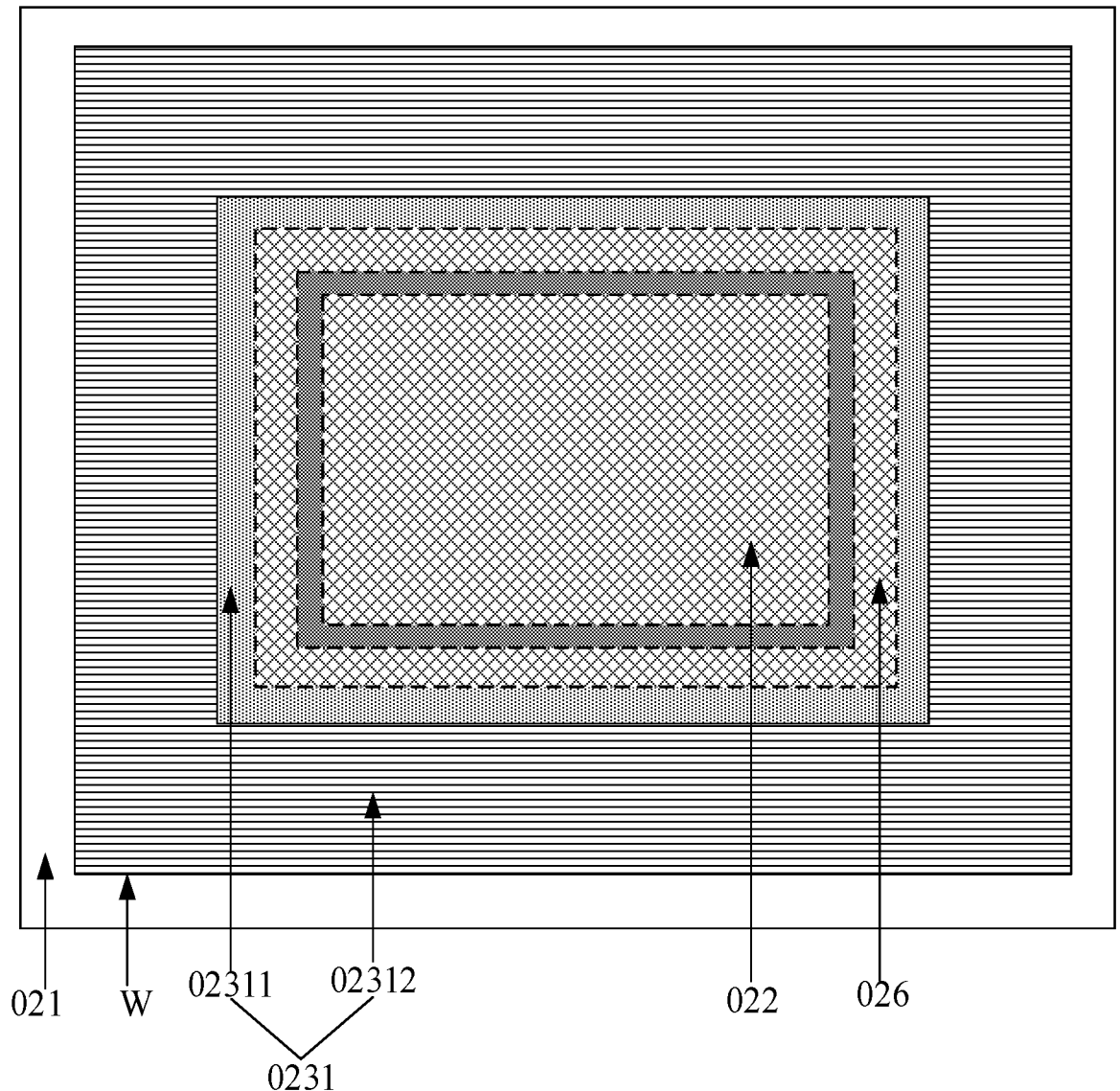
FIG. 6 is a top view of the light-emitting device shown in FIG. 5.
Figure 7:
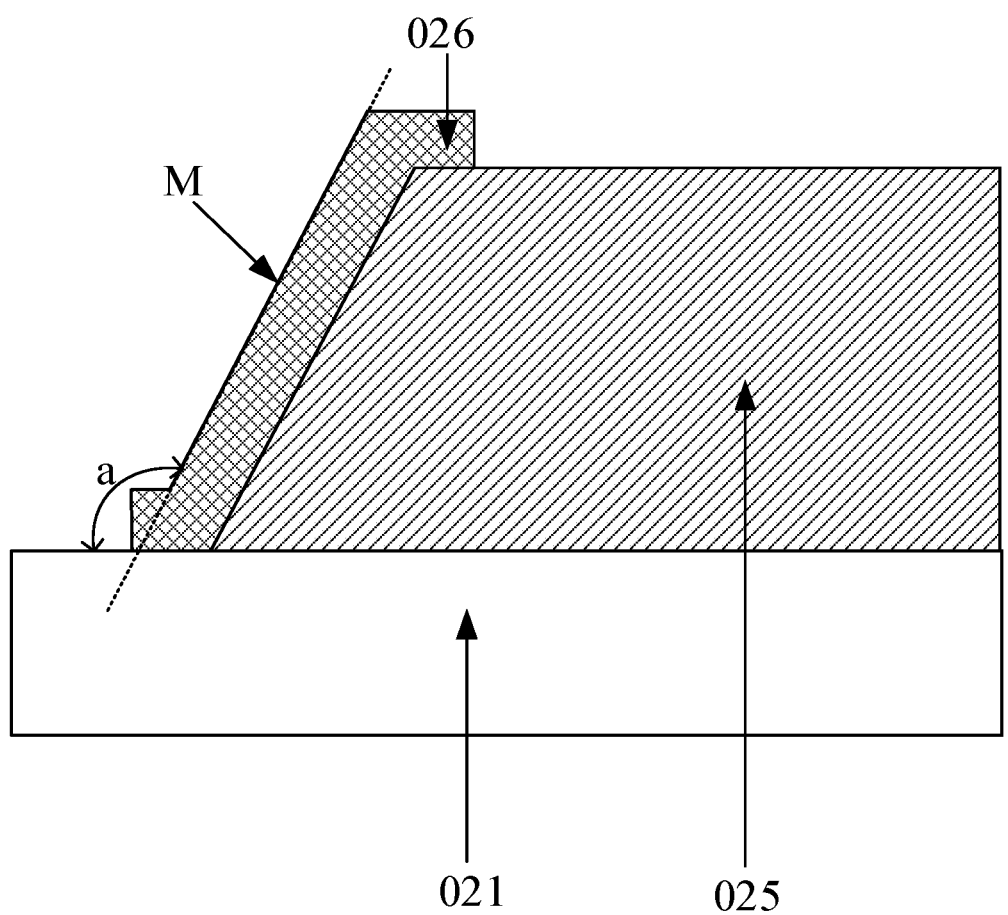
FIG. 7 is an enlarged view of a region Q of the light-emitting device shown in FIG. 5.

Optionally, referring to FIG. 5 and FIG. 6, FIG. 5 is a schematic structural diagram of another light-emitting device 02 according to an embodiment of the present disclosure and FIG. 6 is a top view of the light-emitting device 02 shown in FIG. 5. Referring to FIG. 5 and FIG. 6, the light-emitting device 02 further includes a reflective layer 026 arranged to surround the light-emitting unit 022. Optionally, the reflective layer 026 is arranged to surround the first electrode 0221. Optionally, FIG. 7 is an enlarged view of a region Q of the light-emitting device 02 shown in FIG. 5. Referring to FIG. 5 and FIG. 7, an included angle a is defined between a reflective surface M of the reflective layer 026 and a substrate surface of the base substrate 021. The included angle a may be an obtuse angle, for example, an angle of 120 degrees, 140 degrees or 150 degrees, or the like. It is easy to understand that FIG. 7 shows a structure relevant to the included angle a in the region Q but does not show other structures in the region Q.

Optionally, as shown in FIG. 5, the planarization layer 025 is provided with a groove G. An area of an opening surface of the groove G may be greater than an area of the light-emitting opening K of the defining layer 024. An orthographic projection of the groove G on the base substrate 021 covers an opening of the light-emitting opening K of the defining layer 024 on the base substrate 021. The reflective layer 026 is disposed on a side wall (not shown in FIG. 4) of the groove G and surrounding the first electrode 0221. The reflective surface M of the reflective layer 026 faces towards the light-emitting opening K of the defining layer 024. The reflective surface M of the reflective layer 026 refers to a surface, distal from the side wall of the groove G of the planarization layer 025, of the reflective layer 026. A material of the reflective layer 026 may be the same as a material of the first electrode 0221. The reflective layer 026 and the first electrode 0221 may be formed simultaneously, that is, the reflective layer 026 and the first electrode 0221 may be prepared by the same process. The light-emitting device 02 shown in FIG. 5 may be a reflective cup type light-emitting device.

Optionally, as shown in FIG. 5 and FIG. 6, the base substrate 021 is provided with a packaging region W. An orthographic projection of the light-emitting unit 022 on the base substrate 021 and an orthographic projection of the reflective layer 026 on the base substrate 021 fall within the packaging region W. An orthographic projection of the first packaging portion 02311 on the base substrate 021 completely covers an orthographic projection of the light-emitting unit 022 on the base substrate 021 and completely covers the orthographic projection of the reflective layer 026 on the base substrate 021. An orthographic projection of the second packaging portion 02312 on the base substrate 021 covers a region in the packaging region W other than a region where the orthographic projection of the first packaging portion 02311 on the base substrate 021 is disposed, that is, an orthographic projection of the target packaging film layer 0231 on the base substrate 021 completely covers the packaging region W. Therefore, the target packaging film layer 0231 is formed by the adjacent first packaging portion 02311 and second packaging portion 02312, that is, the boundary of the first packaging portion 02311 is a junction of the first packaging portion 02311 and the second packaging portion 02312.

Optionally, as shown in FIG. 5, a second horizontal distance defined between a boundary of the first packaging portion 02311 and a boundary of the reflective layer 026 is d2. The second horizontal distance d2 is in a range of about 1 micron to 4 microns, thereby reducing a precision requirement on a preparation process of the first packaging portion 02311 while ensuring the orthographic projection of the first packaging portion 02311 on the base substrate 021 to completely cover the orthographic projections of the light-emitting unit 022 and the reflective layer 026 on the base substrate 021 so as to facilitate preparation of the first packaging portion 02311. In the embodiment of the present disclosure, the second horizontal distance d2 being in a range of about 1 micron to 4 microns may mean that the range of the second horizontal distance d2 may fluctuate 20% left and right on the basis of the range of 1 microns to 4 microns; and optionally, the second horizontal distance d2 may be in a range of (1±1×20%) microns to (4±4×20%) microns, that is, the second horizontal distance d2 may be in a range of (1±0.2) microns to (4±0.8) microns. For example, the second horizontal distance d2 may be in a range of 0.8 microns to 3.2 microns, or the second horizontal distance d2 may be in a range of 1.2 microns to 4.8 microns, or the second horizontal distance d2 may be in a range of 0.8 microns to 4.8 microns, or the second horizontal distance d2 may be in a range of 1.2 microns to 3.2 microns. For example, d2=2 microns, d2=2.5 microns, d2=3 microns, or the like. The horizontal distance d2 may be the minimum distance between the boundary of the first packaging portion 02311 and the boundary of the reflective surface M of the reflective layer 026 in a direction parallel to a substrate surface of the base substrate 021.

Optionally, as shown in FIG. 3 and FIG. 5, the target packaging film layer 0231 is a packaging film layer, most proximal to the light-emitting unit 022, of the at least one packaging film layer of the thin film packaging structure 023. The target packaging film layer 0231 may be an inorganic layer. In the embodiment of the present disclosure, the thin film packaging structure 023 may include inorganic layers and an organic layer which are alternately superimposed along a direction going distally from the light-emitting unit 022; and in the thin film packaging structure 023, a packaging film layer most proximal to the light-emitting unit 022 and a packaging film layer most distal from light-emitting unit 022 may be inorganic layers, and the target packaging film layer 0231 is the inorganic layer most proximal to the light-emitting unit 022. For example, as shown in FIG. 3 and FIG. 5, the thin film packaging structure 023 includes a target packaging film layer 0231 (inorganic layer), an organic layer 0232 and an inorganic layer 0233 which are sequentially superimposed in a direction going distally from the light-emitting unit 022. It is easy to understand that the embodiment of the present disclosure illustrates by taking the case where the thin film packaging structure 023 includes three packaging film layers and the packaging film layer most proximal to the light-emitting unit 022 is the target packaging film layer as an example. The thin film packaging structure 023 may further include two packaging film layers or include more than three packaging film layers. A plurality of target packaging film layers may be arranged as long as the thin film packaging structure 023 includes inorganic layers and an organic layer which are alternately superimposed and the thin film packaging structure 023 includes the target packaging film layers, which is not limited in the embodiment of the present disclosure.

Optionally, in the embodiment of the present disclosure, a difference between a refractive index of the second packaging portion 02312 and a refractive index of the first packaging portion 02311 is in a range of about 0.1 to 0.5, thereby ensuring that light can be better refracted to the side where the light emitting surface of the light-emitting device 02 is disposed when being emitted into the second packaging portion 02312 from the first packaging portion 02311. During design, the range of an expected angle of refraction may be determined firstly, and then the range of a difference between the refractive index of the second packaging portion 02312 and the refractive index of the first packaging portion 02311 is determined according to the range of the expected angle of refraction and a refraction law. In the embodiment of the present disclosure, the difference between the refractive index of the second packaging portion 02312 and the refractive index of the first packaging portion 02311 being in a range of about 0.1 to 0.5 may mean that the range of the difference between the refractive index of the second packaging portion 02312 and the refractive index of the first packaging portion 02311 may fluctuate 20% left and right on the basis of the range of 0.1 to 0.5; and optionally, the range of the difference between the refractive index of the second packaging portion 02312 and the refractive index of the first packaging portion 02311 may be (0.1±0.1×20%) to (0.5±0.5×20%), that is, the range of the difference between the refractive index of the second packaging portion 02312 and the refractive index of the first packaging portion 02311 may be (0.1±0.02) to (0.5±0.04). For example, the range of the difference between the refractive index of the second packaging portion 02312 and the refractive index of the first packaging portion 02311 may be 0.08 to 0.46, or the range of the difference between the refractive index of the second packaging portion 02312 and the refractive index of the first packaging portion 02311 may be 0.12 to 0.54, or the range of the difference between the refractive index of the second packaging portion 02312 and the refractive index of the first packaging portion 02311 may be 0.08 to 0.54, or the range of the difference between the refractive index of the second packaging portion 02312 and the refractive index of the first packaging portion 02311 may be 0.12 to 0.46.

Optionally, the refractive index of the first packaging portion 02311 is in a range of about 1.45 to 1.55 and the refractive index of the second packaging portion 02312 is in a range of about 1.65 to 1.85, thereby ensuring that the difference between the refractive index of the first packaging portion 02311 and the refractive index of the second packaging portion 02312 meets the requirement on the range of the difference range. The refractive index of the first packaging portion 02311 is in a range of about 1.45 to 1.55 and the refractive index of the second packaging portion 02312 is in a range of about 1.65 to 1.85, thereby facilitating selection of a material of the first packaging portion 02311 and a material of the second packaging portion 02312 so as to facilitate preparation of the first packaging portion 02311 and the second packaging portion 02312. It is easy for those skilled in the part to understand that the range of the refractive index of the first packaging portion 02311 and the range of the refractive index of the second packaging portion 02312 may further be other ranges as long as the difference between the refractive index of the first packaging portion 02311 and the refractive index of the second packaging portion 02312 meets the above requirement on the range of the difference.

In the embodiment of the present disclosure, the refractive index of the first packaging portion 02311 being in a range of about 1.45 to 1.55 may mean that the range of the refractive index of the first packaging portion 02311 may fluctuate 20% left and right on the basis of 1.45 to 1.55; and the refractive index of the second packaging portion 02312 being in a range of about 1.65 to 1.85 may mean that the range of the refractive index of the second packaging portion 02312 may fluctuate 20% left and right on the basis of 1.65 to 1.85. Optionally, the refractive index of the first packaging portion 02311 may be in a range of (1.45±1.45×20%) to (1.55±1.55×20%) and the refractive index of the second packaging portion 02312 may be in a range of (1.65±1.65× 20%) to (1.85±1.85×20%), that is, the refractive index of the first packaging portion 02311 may be in a range of (1.45±0.29) to (1.55±0.31) and the refractive index of the second packaging portion 02312 may be in a range of (1.65±0.33) to (1.85±0.37). For example, the refractive index of the first packaging portion 02311 may be in a range of 1.16 to 1.24, or the refractive index of the first packaging portion 02311 may be in a range of 1.74 to 1.86, or the refractive index of the first packaging portion 02311 may be in a range of 1.16 to 1.86; and the refractive index of the second packaging portion 02312 may be in a range of 1.32 to 1.48, or the refractive index of the second packaging portion 02312 may be in a range of 1.98 to 2.22, or the refractive index of the second packaging portion 02312 may be in a range of 1.32 to 2.22.

Optionally, a material of the first packaging portion 02311 may include silicon oxide (SiOx), and a material of the second packaging portion 02312 may include silicon oxynitride (SiOxNy), thereby meeting the requirements on the refractive indexes of the first packaging portion 02311 and the second packaging portion 02312. It is easy to understand that the material of the first packaging portion 02311 and the material of the second packaging portion 02312 are not limited herein as long as the above requirement on the refractive index is ensured to be met.

In the embodiment of the present disclosure, the light-emitting device 02 may be an electroluminescence (EL) device, the light-emitting unit 022 may be an electroluminescence unit and the light-emitting unit 0222 may be an electroluminescence layer, for example, the light-emitting device 02 may be an OLED device or a quantum dot light emitting diodes (QLED) device. In the light-emitting device 02 shown in FIG. 3 and FIG. 5, the first electrode 0221 may be an anode, and the second electrode 0223 may be a cathode. Optionally, the light-emitting device 02 may be a display device, the defining layer 024 may be a pixel defining layer (PDL), the light-emitting device 02 may further include a switching unit such as a thin film transistor (TFT), a driving circuit such as a pixel circuit and an optional functional layer such as a polarizer, or the like. The planarization layer 025 is mainly configured to planarize a surface of the substrate after the TFT is formed, which is not elaborated herein in the embodiment of the present disclosure.

A process of improving the out-coupling efficiency of the light-emitting device 02 according to the embodiments of the present disclosure is illustrated below with reference to FIG. 8 and FIG. 9.

Figure 8:
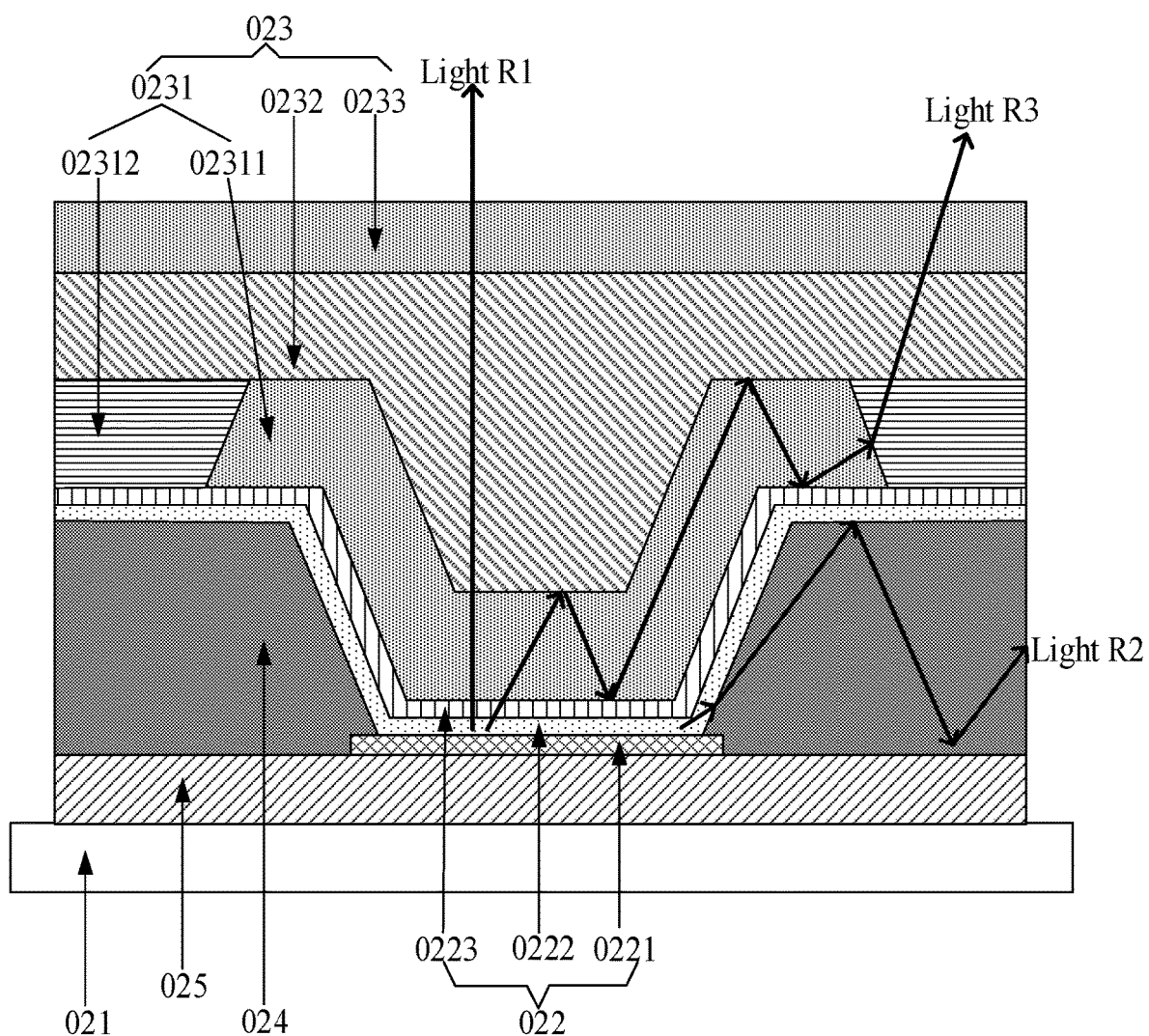
FIG. 8 is a schematic diagram of light propagated in the light-emitting device shown in FIG. 3.

FIG. 8 shows a schematic diagram of light propagated in the emitting device 02 shown in FIG. 3. Referring to FIG. 8, the light-emitting layer 0222 emits light under the action of the first electrode 0221 and the second electrode 0223. In light emitted by the light-emitting layer 0222, light R1 directly passes through the thin film packaging structure 023 and is emitted from a light emitting surface (that is a side, distal from the base substrate 021, of the inorganic layer 0233) of the light-emitting device 02; light R2 is emitted into the defining layer 024, exerts a waveguide effect in the defining layer 024 to be propagated transversely, and is finally consumed by the defining layer 024; and light R3 is emitted into the first packaging portion 02311 of the target packaging film layer 0231 and is propagated in the first packaging portion 02311. When being propagated to an interface of the first packaging portion 02311 and the second packaging portion 02312, the light is refracted to the second packaging portion 02312 from the side where the light emitting surface of the light-emitting device 02 on the interface, and finally pass through the second packaging portion 02312, the organic layer 0232 and the inorganic layer 0233 to be emitted from the light emitting surface of the light-emitting device 02. In the light emitted by the light-emitting layer 0222, the light R1 and the light R3 can be emitted from the light emitting surface of the light-emitting device 02 and only the light R2 is consumed by the light-emitting device 02. Therefore, compared with the OLED device shown in FIG. 1, the light-emitting device 02 shown in FIG. 3 can effectively extract a waveguide energy of the thin film packaging structure and improve the out-coupling efficiency of the light-emitting device.

Figure 9:
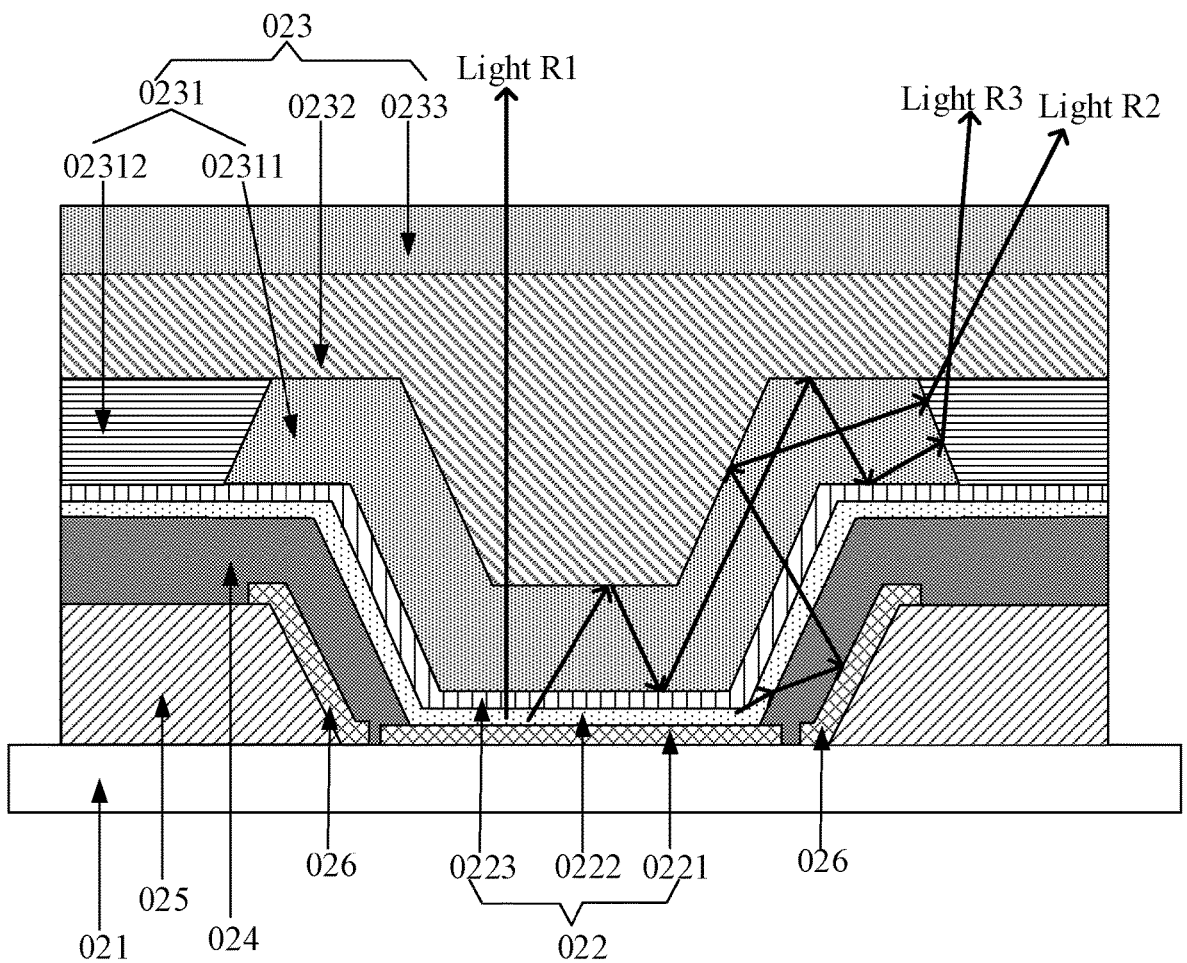
FIG. 9 is a schematic diagram of light propagated in the light-emitting device shown in FIG. 5.

FIG. 9 shows a schematic diagram of light propagated in the emitting device 02 shown in FIG. 5. Referring to FIG. 9, the light-emitting layer 0222 emits light under the action of the first electrode 0221 and the second electrode 0223. In light emitted by the light-emitting layer 0222, light R1 directly passes through the thin film packaging structure 023 and is emitted from a light emitting surface (that is a side, distal from the base substrate 021, of the inorganic layer 0233) of the light-emitting device 02; light R2 is emitted into the defining layer 024, passes through the defining layer 024 to be emitted to the reflective layer 026, then is emitted into the defining layer 024 again after being reflected on the reflective surface M of the reflective layer 026, and sequentially passes through the defining layer 024, the light-emitting layer 0222 and the cathode 0223 to be emitted into the first packaging portion 02311 of the target packaging film layer 0231 and is propagated in the first packaging portion 02311, and the light is refracted to the second packaging portion 02312 from the side where the light emitting surface of the light-emitting device 02 is disposed on the interface when being propagated to the interface of the first packaging portion 02311 and the second packaging portion 02312, and finally passes through the second packaging portion 02312, the organic layer 0232 and the inorganic layer 0233 to be emitted from the light emitting surface of the light-emitting device 02; and light R3 is emitted into the first packaging portion 02311 of the target packaging film layer 0231 and is propagated in the first packaging portion 02311, and the light is refracted to the second packaging portion 02312 from the side where the light emitting surface of the light-emitting device 02 is on the interface when being propagated to the interface of the first packaging layer 02311 and the second packaging portion 02312, and finally passes through the second packaging portion 02312, the organic layer 0232 and the inorganic layer 0233 to be emitted from the light emitting surface of the light emitting device 02. In the light emitted by the light-emitting layer 0222, the light R1, the light R2 and the light R3 can be emitted from the light emitting surface of the light-emitting device 02. Therefore, compared with the OLED device 01 shown in FIG. 1, the light-emitting device 02 shown in FIG. 5 can effectively extract a waveguide energy of the thin film packaging structure and improve the out-coupling efficiency of the light-emitting device.

In the embodiment of the present disclosure, since the refractive index of the first packaging portion 02311 is less than the refractive index of the second packaging portion 02312, an angle of refraction is greater than an angle of incidence when light is refracted on the interface of the first packaging portion 02311 and the second packaging portion 02312, and thus the light (such as the light R3) is refracted to the side where the light emitting surface of the light-emitting device 02 is disposed and is finally emitted from the light emitting surface of the light-emitting device 02. It is easy to understand that light is usually refracted when being emitted from one medium to another medium. Therefore, in the OLED device 01 shown in FIG. 2 or the light-emitting device 02 shown in FIG. 8 and FIG. 9, the light is refracted at a certain angle when being emitted from one film layer to another film layer, and FIG. 8 and FIG. 9 only show refracted light which contributes a lot to improving the out-coupling efficiency and do not show other refracted light. For example, in FIG. 8 and FIG. 9, the light R1 is refracted at a certain angle when being emitted into the second electrode 0223 from the light-emitting layer 0222, being emitted into the first packaging portion 02311 from the second electrode 0223, being emitted into the organic layer 0232 from the first packaging portion 02311, being emitted into the inorganic layer 0233 from the organic layer 0232 and being emitted from the inorganic layer 0233, and FIG. 8 and FIG. 9 do not show the refraction process of the light R1.

Through comparisons among FIG. 2, FIG. 8, and FIG. 9, it is easy to understand that compared with the OLED device shown in FIG. 1, the light-emitting device according to the embodiment of the present disclosure has higher out-coupling efficiency. Furthermore, through comparison between FIG. 8 and FIG. 9, it can be seen that in the two light-emitting devices according to the embodiments of the present disclosure, the light-emitting device (reflective cup type light-emitting device) shown in FIG. 5 has higher out-coupling efficiency compared with that of the light-emitting device (top-emitting light-emitting device) shown in FIG. 3, the light-emitting device shown in FIG. 5 may be suitable from application scenarios with higher requirement on the out-coupling efficiency, and the light-emitting device shown in FIG. 3 may be suitable from application scenarios with lower requirement on the out-coupling efficiency, which is not limited in the embodiments of the present disclosure.

In conclusion, in the light-emitting device according to the embodiment of the present disclosure, the target packaging film layer of the thin film packaging structure is provided with the first packaging portion and the second packaging portion which are arranged in the same layer and are in contact with each other, the orthographic projection of the first packaging portion on the base substrate at least partially overlaps the orthographic projection of the light-emitting unit on the base substrate, the orthographic projection of the second packaging portion on the base substrate at least partially does not overlap the orthographic projection of the light-emitting unit, and the refractive index of the first packaging portion is less than the refractive index of the second packaging portion. After being emitted into the target packaging film layer, the light emitted by the light-emitting unit is firstly propagated in the first packaging portion, then is refracted to the second packaging portion from an interface of the first packaging portion and the second packaging portion to a side where the light emitting surface of the light-emitting device is disposed, and finally passes through the second packaging portion and is emitted from the light emitting surface of the light-emitting device. Therefore, the target packaging film layer may be emitted from the light emitting surface of the light-emitting device by refraction, which contributes to preventing light from generating waveguide effect in the thin film packaging structure and improving the emission efficiency of the light-emitting device.

The light-emitting device according to the embodiments of the present disclosure may be applied to the following method. The manufacturing method and manufacturing principle of the light-emitting device in the embodiments of the present disclosure may be referenced to the description in the following embodiments.

Figure 10:
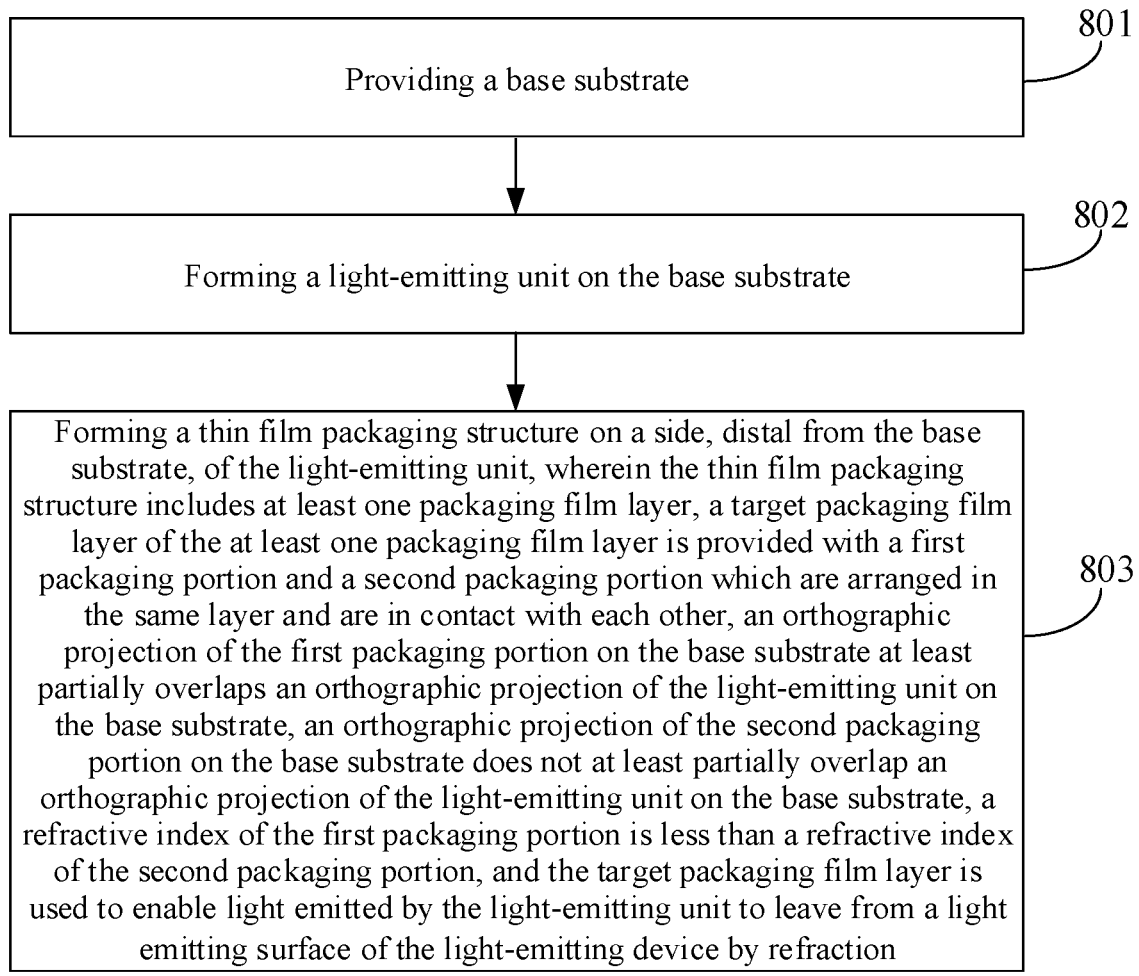
FIG. 10 is a flowchart of a method for manufacturing a light-emitting device according to an embodiment of the present disclosure.

FIG. 10 illustrates a flowchart of another method for manufacturing a light-emitting device according to an embodiment of the present disclosure, and the method may be used to manufacture the light-emitting device according to the above embodiment. Referring to FIG. 10, the method may include the following steps:

In step 801, a base substrate is provided.

In step 802, a light-emitting unit is formed on the base substrate.

In step 803, a thin film packaging structure is formed on a side, distal from the base substrate, of the light-emitting unit, wherein the thin film packaging structure includes at least one packaging film layer. A target packaging film layer of the at least one packaging film layer is provided with a first packaging portion and a second packaging portion which are arranged in the same layer and are in contact with each other. An orthographic projection of the first packaging portion on the base substrate at least partially overlaps an orthographic projection of the light-emitting unit on the base substrate. An orthographic projection of the second packaging portion on the base substrate does not at least partially overlap the orthographic projection of the light-emitting unit on the base substrate. A refractive index of the first packaging portion is less than a refractive index of the second packaging portion. The target packaging film layer is configured to enable light emitted by the light-emitting unit to leave from a light emitting surface of the light-emitting device by refraction.

In conclusion, based on the method for manufacturing the light-emitting device according to the embodiment of the present disclosure, in the light-emitting device, the target packaging film layer of the thin film packaging structure is provided with the first packaging portion and the second packaging portion which are arranged in the same layer and are in contact with each other, the orthographic projection of the first packaging portion on the base substrate at least partially overlaps the orthographic projection of the light-emitting unit on the base substrate, the orthographic projection of the second packaging portion on the base substrate at least partially does not overlap the orthographic projection of the light-emitting unit, and the refractive index of the first packaging portion is less than the refractive index of the second packaging portion. After being emitted into the target packaging film layer, the light emitted by the light-emitting unit is firstly propagated in the first packaging portion, then is refracted to the second packaging portion from the interface of the first packaging portion and the second packaging portion to the side where the light emitting surface of the light-emitting device is disposed, and finally passes through the second packaging portion to be emitted from the light emitting surface of the light-emitting device, thus contributing to preventing the light from generating waveguide effect in the thin film packaging structure and improving the out-coupling efficiency of the light-emitting device.

optionally, step 803 may include:

forming a first packaging portion on the side, distal from the base substrate, of the light-emitting unit;

forming a second packaging portion on the side, distal from the base substrate, of the light-emitting unit, wherein the first packaging portion and the second packaging portion form the target packaging layer; and forming an organic layer is formed on a side, distal from the light-emitting unit, of the target packaging film layer.

Optionally, the method further includes: forming a reflective layer surrounding the light-emitting unit, wherein an included angle is defined between a reflective surface of the reflective layer and a substrate surface of the base substrate.

Optionally, step 802 may include:

forming a first electrode, a light-emitting unit, and a second electrode which are sequentially superimposed on the base substrate.

Forming the reflective layer surrounding the light-emitting unit includes:

forming a reflective layer surrounding the first electrode.

Optionally, the reflective layer and the first electrode are formed simultaneously.

Optionally, before forming the reflective layer surrounding the first electrode, the method further includes:

forming a planarization layer on the base substrate, wherein the planarization layer is provided with a groove.

Accordingly, forming the reflective layer surrounding the first electrode includes: forming the reflective layer surrounding the first electrode on a side wall of the groove.

Optionally, the method further includes: forming a defining layer is formed, wherein the defining layer is provided with a light-emitting opening, and the light-emitting unit is disposed in the light-emitting opening.

All the above alternative technical solutions may be combined in any combination to form an alternative embodiment of the present disclosure, which will not be repeated in detail herein.

Figure 11:
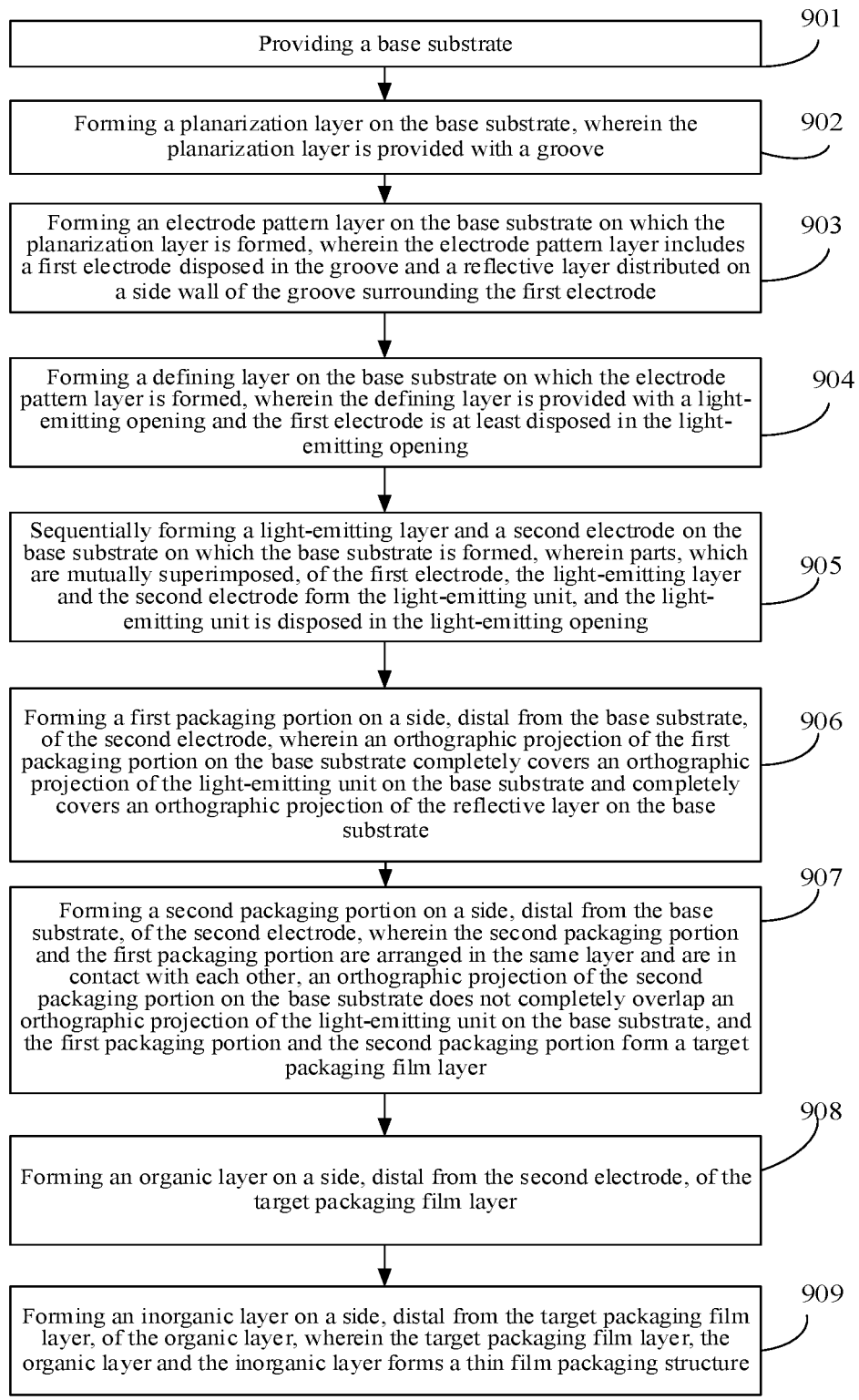
FIG. 11 is a flowchart of another method for manufacturing a light-emitting device according to an embodiment of the present disclosure.

Referring to FIG. 11 which shows a flowchart of another method for manufacturing another light-emitting device according to an embodiment of the present disclosure, the method may be used to manufacture the light-emitting device according to the embodiment of the present disclosure. The embodiment of the present disclosure gives illustration by taking manufacturing the light-emitting device 02 shown in FIG. 5 as an example. A manufacturing process of the light-emitting device 02 shown in FIG. 3 may be referenced to the embodiment. Referring to FIG. 11, the method may include the following steps:

In step 901, a base substrate is provided.

The base substrate may be a rigid substrate made of a material with certain firmness such as glass, quartz, transparent resin or the like. For example, the base substrate is a glass substrate, or the base substrate may be a flexible substrate made of a flexible material such as polyimide (PI), or the like. When the base substrate is the flexible substrate, the base substrate may be provided by the rigid substrate (that is, the base substrate is arranged on the rigid substrate).

In step 902, a planarization layer is formed on the base substrate, wherein the planarization layer is provided with a groove.

Figure 12:
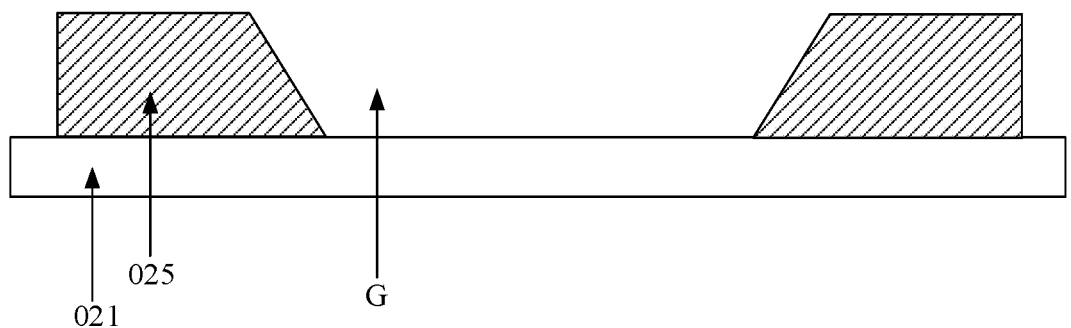
FIG. 12 to FIG. 18 are schematic diagrams of manufacturing processes of light-emitting devices according to embodiments of the application.

Referring to FIG. 12 which shows a schematic diagram after a planarization layer 025 is formed on the base substrate 021 according to an embodiment of the present disclosure, the planarization layer 025 is provided with a groove G, wherein an opening of the groove G may be in a shape of a trumpet, a depth of the groove G may be equal to a thickness of the planarization layer 025, and the thickness of the planarization layer 025 may be a size of the planarization layer 025 in a direction vertical to a substrate surface of the base substrate 021.

Optionally, a material of the planarization layer 025 may include a transparent organic material such as organic resin, or the like, or a material of the planarization layer 025 may include a transparent inorganic material such as SiOx, SiNx (silicon nitride), Al2O3(aluminum oxide) or SiOxNy, or the like. By taking the case where "a material of the planarization layer 025 is organic resin" as an example, optionally, forming the planarization layer 025 on the base substrate 021 may include: depositing one layer of organic layer on the base substrate 021 by magnetron sputtering, thermal evaporation or plasma enhanced chemical vapor deposition (PECVD), or the like to obtain a resin material layer; and sequentially subjecting the resin material layer to exposure and developing to obtain the planarization layer 025.

In step 903, an electrode pattern layer is formed on the base substrate on which the planarization layer is formed, wherein the electrode pattern layer includes a first electrode disposed in the groove and a reflective layer distributed on the side wall of the groove surrounding the first electrode.

Figure 13:
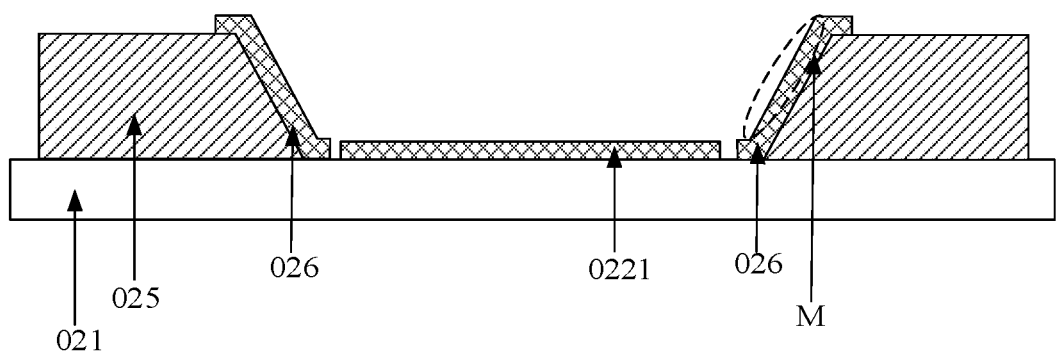

FIG. 13 shows a schematic diagram after an electrode pattern layer (not shown in FIG. 11) is formed on a base substrate 021 on which a planarization layer 025 is formed according to an embodiment of the present disclosure. Referring to FIG. 12 and FIG. 13, the electrode pattern layer includes a first electrode 0221 disposed in the groove G of the planarization layer 025 and a reflective layer 026 distributed on the side wall of the groove G surrounding the first electrode 0221, wherein an included angle is defined between a reflective surface M of the reflective layer 026 and a substrate surface of the base substrate 021.

Optionally, a material of the electrode pattern layer may include molybdenum (Mo), copper (Cu), aluminum (Al), and an alloy thereof. By taking the case where the material of the electrode pattern layer is Mo as an example, optionally, forming the electrode pattern layer on the base substrate 021 on which the planarization layer 025 is formed may include: depositing one layer of Mo on the base substrate 021 on which the planarization layer 025 is formed by magnetron sputtering, thermal evaporation or PECVD, or the like to obtain a Mo material layer, and treating the Mo material layer by a patterning process to obtain the electrode pattern layer.

In step 904, a defining layer is formed on the base substrate on which the electrode pattern layer is formed, wherein the defining layer is provided with a light-emitting opening, and the first electrode is at least disposed in the light-emitting opening.

Figure 14:
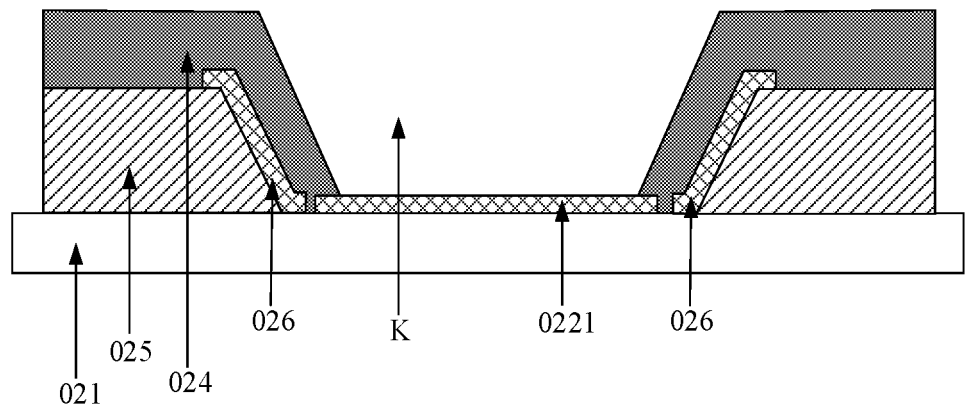

Referring to FIG. 14 which shows a schematic diagram after a defining layer 024 is formed on the base substrate 021 on which the electrode pattern layer is formed according to an embodiment of the present disclosure, the defining layer 024 is provided with a light-emitting opening K. Referring to FIG. 12 to FIG. 14, the light-emitting opening K is disposed in the groove G and the first electrode 0221 is at least disposed in the light-emitting opening K.

Optionally, a material of the defining layer 024 may include a transparent organic material such as organic resin, or the like, or a material of the defining layer 024 may include a transparent inorganic material such as SiOx, SiNx, Al2O3 or SiOxNy, or the like. By taking the case where the material of the defining layer 024 is SiOx as an example, optionally, forming the defining layer 024 on the base substrate 021 on which the electrode pattern layer is formed may include: depositing one layer of SiOx on the base substrate 021 on which the electrode pattern layer is formed by magnetron sputtering, thermal evaporation or PECVD, or the like to obtain a SiOx material layer; and treating the SiOx material layer by a patterning process to obtain the defining layer 024.

In step 905, a light-emitting layer and a second electrode are sequentially formed on the base substrate on which the defining layer is formed, wherein parts, which are mutually superimposed, of the first electrode, the light-emitting layer, and the second electrode form a light-emitting unit, and the light-emitting unit is disposed in the light-emitting opening.

Figure 15:
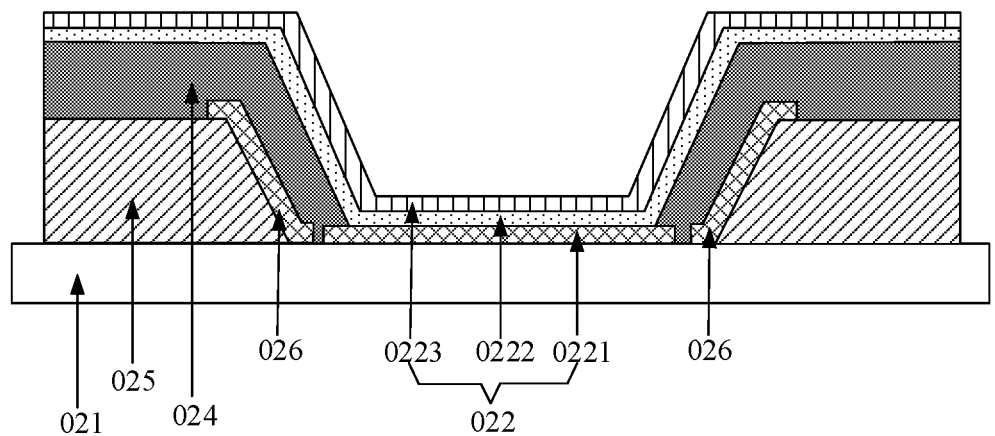

Referring to FIG. 15 which shows a schematic diagram after a light-emitting layer 0222 and a second electrode 0223 are sequentially formed on a base substrate 021 on which a defining layer 024 is formed according to an embodiment of the present disclosure, the light-emitting layer 0222 and the second electrode 0223 are sequentially superimposed, and the light-emitting layer 0222, and the second electrode 0223 are partially disposed in the light-emitting opening K; parts, disposed in the light-emitting opening K, of the light-emitting layer 0222 and the second electrode 0223 are superimposed with the first electrode 0221; parts, which are mutually superimposed, of the first electrode 0221, the light-emitting layer 0222 and the second electrode 0223 form a light-emitting unit 022; and the light-emitting unit 022 is disposed in the light-emitting opening K.

Optionally, a material of the light-emitting layer 0222 may include an electroluminescence material, for example, an organic light-emitting material; and a material of the second electrode 0223 may include metal oxide such as indium tin oxide (ITO), indium zinc oxide (IZO) or aluminum-doped zinc oxide (ZnO:Al), or the like. By taking the case where "the material of the light-emitting layer 0222 is the organic light-emitting material and the material of the second electrode 0223 is ITO" as an example, optionally, sequentially forming the light-emitting layer 0222 and the second electrode 0223 on the base substrate 021 on which the defining layer 024 is formed may include: firstly, forming one layer of organic light-emitting material and printing the layer on the base substrate 021 on which the defining layer 024 is formed by an inkjet printing process, and drying the printed organic light-emitting material to obtain the light-emitting layer 0222; then depositing one layer of ITO on the base substrate 021 on which the light-emitting layer 0222 is formed by magnetron sputtering, thermal evaporation or PECVD, or the like to obtain an ITO material layer; and treating the ITO material layer by a patterning process to obtain the second electrode 0223.

In step 906, a first packaging portion is formed on a side, distal from the base substrate, of the second electrode, wherein an orthographic projection of the first packaging portion on the base substrate completely covers an orthographic projection of the light-emitting unit on the base substrate and completely covers an orthographic projection of the reflective layer on the base substrate.

Figure 16:
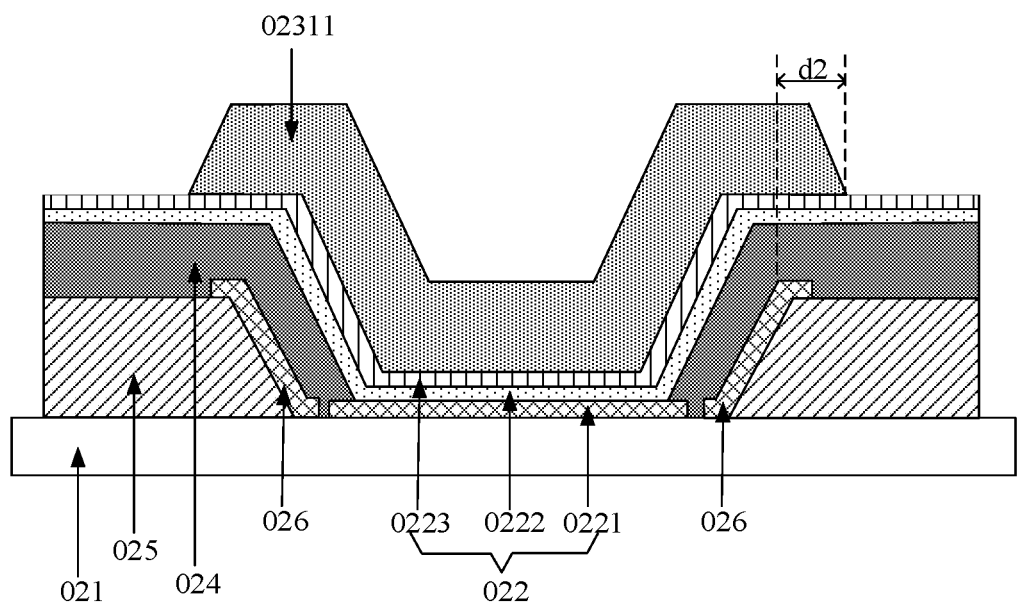

FIG. 16 shows a schematic diagram after a first packaging portion 02311 is formed on a side, distal from a base substrate 021, a second electrode 0223 according to an embodiment of the present disclosure. Referring to FIG. 16 and FIG. 6, an orthographic projection of the first packaging portion 02311 on the base substrate 021 completely covers an orthographic projection of the light-emitting unit 022 on the base substrate 021 and completely covers an orthographic projection of the reflective layer 026 on the base substrate 021, and a second horizontal distance d2 between a boundary of the first packaging portion 02311 and a boundary of a reflective surface of the reflective layer 026 is in a range of about 1 micron to 4 microns.

Optionally, a material of the first packaging portion 02311 may include SiOx. Forming first packaging portion 02311 on the side, distal from the base substrate 021, of the second electrode 0223 may include: forming the first packaging portion 02311 on the side, distal from the base substrate 021, of the second electrode 0223 by the SiOx. For example, one layer of SiOx is deposited on a side, distal from the base substrate 021, of the second electrode 0223 by magnetron sputtering, thermal evaporation or PECVD, or the like to obtain a SiOx material layer, and then the SiOx material layer is treated by a patterning process to obtain the first packaging portion 02311.

In step 907, a second packaging portion is formed on a side, distal from the base substrate, of the second electrode, wherein the second packaging portion and the first packaging portion are arranged in the same layer and are in contact with each other, an orthographic projection of the second packaging portion on the base substrate does not completely overlap an orthographic projection of the light-emitting unit on the base substrate, and the first packaging portion and the second packaging portion form a target packaging film layer.

Figure 17:
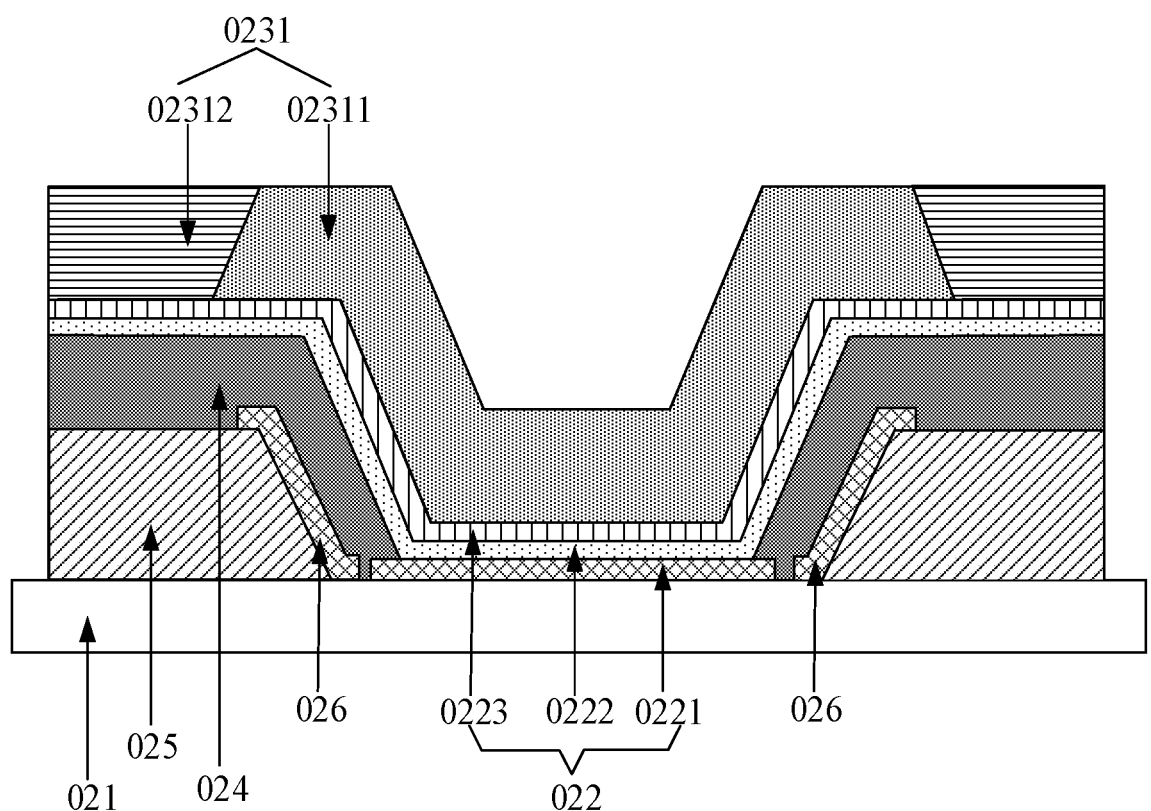

Referring to FIG. 17 which shows a schematic diagram after a second packaging portion 02312 is formed on a side, distal from the base substrate 021, of the second electrode 0223, the second packaging portion 02312 and the first packaging portion 02311 are arranged in the same layer and are in contact with each other. Referring to FIG. 17 and FIG. 6, an orthographic projection of the second packaging portion 02312 on the base substrate 021 does not overlap an orthographic projection of the light-emitting unit 022 on the base substrate 021, and the first packaging portion and the second packaging portion 02312 form a target packaging film layer 0231. A refractive index of the first packaging portion 02311 is less than a refractive index of the second packaging portion 02312, a material of the first packaging portion 02311 includes SiOx, and a material of the second packaging portion 02312 may include SiOxNy.

Optionally, forming the second packaging portion 02312 on the side, distal from the base substrate 021, of the second electrode 0223 may include: the second packaging portion 02312 is formed on a side, distal from the base substrate 021, of the second electrode 0223 by the SiOxNy. For example, one layer of SiOxNy is deposited on a side, distal from the base substrate 021, of the second electrode 0223 by magnetron sputtering, thermal evaporation or PECVD, or the like to obtain a SiOxNy material layer, and then the SiOxNy material layer is treated by a patterning process to obtain the second packaging portion 02312.

In step 908, an organic layer is formed on a side, distal from the second electrode, of the target packaging film layer.

Figure 18:
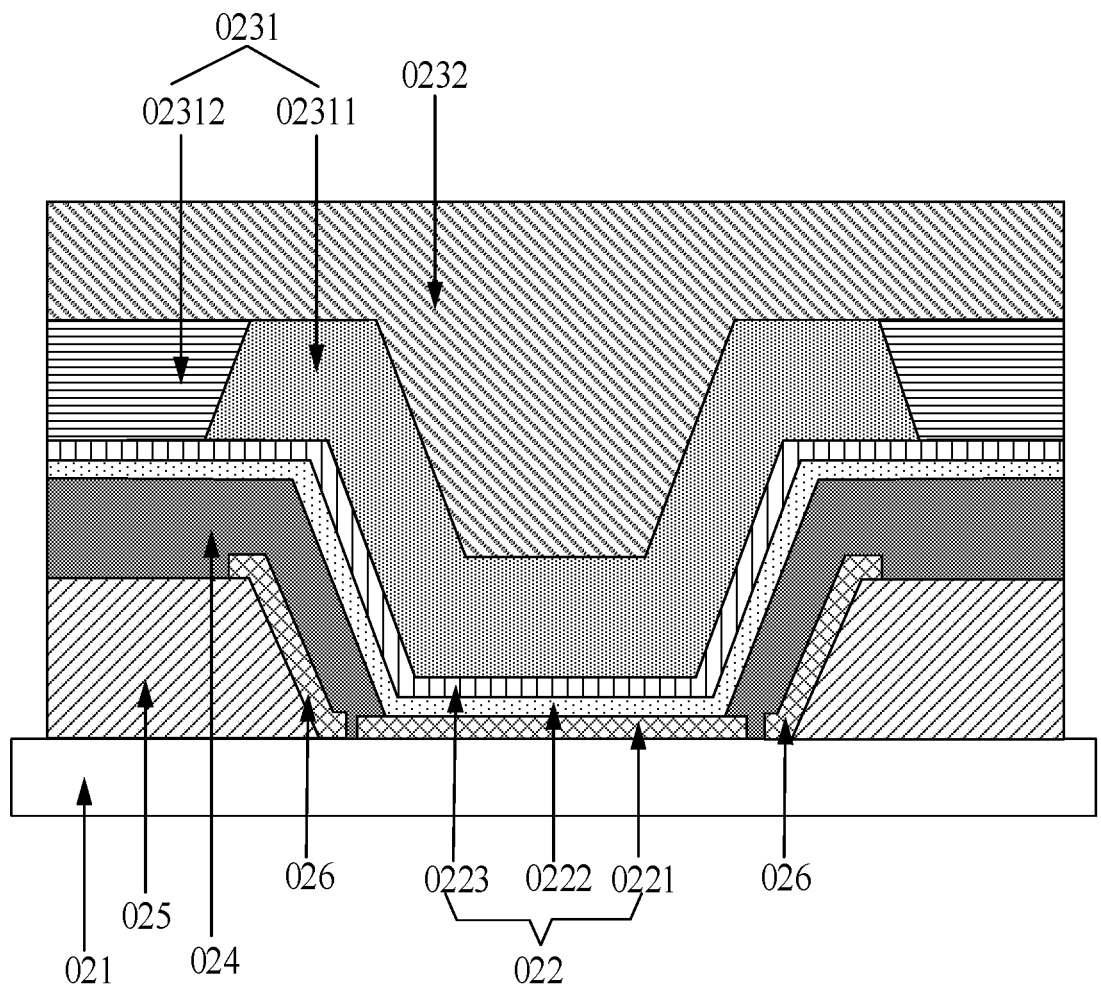

Referring to FIG. 18 which shows a schematic diagram after an organic layer 0232 is formed on a side, distal from a second electrode 0223, of a target packaging film layer 0231 according to an embodiment of the present disclosure, the organic layer 0232 is of an entire layer structure covering the target packaging film layer 0231, and a material of the organic layer 0232 may be organic resin.

Optionally, forming the organic layer 0232 on the side, distal from the second electrode 0223, of the target packaging film layer 0231 may include: printing one layer of organic resin on the side, distal from the second electrode 0223, of the target packaging film layer 0231 by an inkjet printing process; and drying the printed organic resin to obtain the organic layer 0232.

In step 909, an inorganic layer is formed on a side, distal from the target packaging film layer, of the organic layer, the target packaging film layer, wherein the organic layer and the inorganic layer form a thin film packaging structure.

A schematic diagram after an organic layer 0233 is formed on a side, distal from a target packaging film layer 0231, of an organic layer 0232 may be referenced to FIG. 5, and the target packaging film layer 0231, the organic layer 0232, and the inorganic layer 0233 form a thin film packaging structure 023. A material of the inorganic layer 0233 may include a transparent inorganic material such as SiOx, SiNx, Al2O3, SiOxNy and the like.

By taking the case where the material of the inorganic layer 0233 is SiOx as an example, optionally, forming the inorganic layer 0233 on a side, distal from the target packaging film layer 0231, of the organic layer 0232 may include: by magnetron sputtering, thermal evaporation, or PECVD or the like, depositing a layer of SiOx on the side, distal from the target packaging film layer 0231, of the organic layer 0232, to obtain a SiOx material layer, and the SiOx material layer is treated by a patterning process to obtain the inorganic layer 0233.

In the method for manufacturing the light-emitting device according to the embodiments of the present disclosure, the related patterning process may include photoresist coating, exposure, development, etching, and photoresist stripping. Treating the material layer (such as the ITO material layer) by the patterning process may include: coating the material layer (such as the ITO material layer) with one layer of photoresist to form a photoresist layer, exposing the photoresist layer by a mask to enable the photoresist layer to form a complete exposure region and a non-exposure region, then performing a treatment by a developing process to completely remove the photoresist in the complete exposure region and remain all the photoresist in the non-exposure region, etching a region corresponding to the complete exposure region on the material layer (such as the ITO material layer) by an etching process, and finally stripping the photoresist in the non-exposure region to obtain a corresponding structure (such as the second electrode 0223). It can be easily understood that herein illustration is given by taking the case where the photoresist is positive photoresist as an example. When the photoresist is a negative photoresist, the patterning process may be referenced to the description in this paragraph, which is not elaborated in this embodiment of the present disclosure.

The sequence of steps of the method for manufacturing a light-emitting device according to the embodiments of the present disclosure may be adjusted appropriately, and steps may also be increased or decreased according to the conditions. For example, when the light-emitting device is a display device, the method may further include processes of forming a thin film transistor, a pixel circuit, a polarizer, or the like. Any methods that are derived by a person skilled in the art based on the technical content of the present disclosure should be covered within the protection scope of the present disclosure, which are thus not elaborated herein.

In summary, in a light-emitting device manufactured by a method for manufacturing a light-emitting device according to the embodiments of the present disclosure, the target packaging film layer of the thin film packaging structure is provided with a first packaging portion and a second packaging portion which are arranged in the same layer and are in contact with each other, an orthographic projection of the first packaging portion on the base substrate at least partially overlap an orthographic projection of the light-emitting unit on the base substrate, an orthographic projection of the second packaging portion on the base substrate at least partially does not overlap the orthographic projection of the light-emitting unit, and a refractive index of the first packaging portion is less than a refractive index of the second packaging portion. After being emitted into the target packaging film layer, the light emitted by the light-emitting unit is firstly propagated in the first packaging portion, then is refracted to the second packaging portion from an interface of the first packaging portion and the second packaging portion to a side where the light emitting surface of the light-emitting device is disposed, and finally passes through the second packaging portion and is emitted from the light emitting surface of the light-emitting device. Therefore, the target packaging film layer may be emitted from the light emitting surface of the light-emitting device by refraction, which contributes to preventing light from generating waveguide effect in the thin film packaging structure and improving the emission efficiency of the light-emitting device.

Based on the same inventive concept, the embodiment of the present disclosure further provides a display device. The display device includes the light-emitting device 02 according to the above embodiments. The light-emitting device 02 may be an electroluminescence device, for example, the light-emitting device 02 is an OLED device or a QLED device. Accordingly, the display device may be an OLED display device or a QLED display device.

Optionally, the display device may be any products or parts with a display function, such as electronic paper, a display substrate, a display panel, a watch, a bracelet, a mobile phone, a tablet computer, a television, a display, a notebook computer, a digital photo frame, a navigator, or the like.

It should be understood that the term "at least one" herein represents one or a plurality, and a plurality represents more than one. Terms like "first", "second", or the like are only used for description, cannot be interpreted as indication or implication of relative importance, and cannot be interpreted as indication or implication of sequence.

It will be appreciated by those of ordinary skill in the art that all or a part of the steps of implementing the embodiments described above may be accomplished by hardware or may also be accomplished by programs instructing related hardware. The programs are stored in a computer-readable storage medium, the storage medium mentioned may be a read-only memory, a magnetic disk, an optical disk, or the like.

Described above are only optional embodiments of the present disclosure and are not intended to be limiting of the present disclosure, and any modifications, equivalent substitutions, improvements and the like within the spirit and principles of the present disclosure are intended to be embraced by the protection range of the present disclosure.

What is claimed is:

1. A light-emitting device, comprising:
a base substrate;
a light-emitting unit disposed on the base substrate; and
a thin film packaging structure disposed on a side of the light-emitting unit distal from the base substrate;
wherein the thin film packaging structure comprises a packaging film layer comprising a first packaging portion and a second packaging portion, and the first packaging portion and the second packaging portion are arranged in the same layer and are in contact with each other,
wherein an orthographic projection of the first packaging portion on the base substrate at least partially overlaps an orthographic projection of the light-emitting unit on the base substrate, and an orthographic projection of the second packaging portion on the base substrate at least partially does not overlap the orthographic projection of the light-emitting unit;
a refractive index of the first packaging portion is less than a refractive index of the second packaging portion, and the packaging film layer is configured to enable light emitted by the light-emitting unit to leave from a light-emitting surface of the light-emitting device by refraction; and
the thin film packaging structure comprises inorganic layers and organic layers which are alternately superimposed along a direction going distally from the light-emitting unit; and in the thin film packaging structure, a packaging film layer most proximal to the light-emitting unit and a packaging film layer most distal from the light-emitting unit are inorganic layers, and the packaging film layer is an inorganic layer most proximal to the light-emitting unit.

2. The light-emitting device according to claim 1, wherein the packaging film layer is a packaging film layer, most proximal to the light-emitting unit, of the thin film packaging structure.

3. The light-emitting device according to claim 1, wherein a difference between the refractive index of the second packaging portion and the refractive index of the first packaging portion is in a range of about 0.1 to 0.5.

4. The light-emitting device according to claim 1, wherein a first horizontal distance between a boundary of the first packaging portion and a boundary of the light-emitting unit is in a range of about 2 microns to 6 microns, the first horizontal distance being a minimum distance between the boundary of the first packaging portion and the boundary of the second packaging portion in a direction parallel to a substrate surface of the base substrate.

5. The light-emitting device according to claim 1, wherein the base substrate is provided with a packaging region, the orthographic projection of the light-emitting unit on the base substrate falls within the packaging region, the orthographic projection of the first packaging portion on the base substrate completely covers an orthographic projection of the light-emitting unit on the base substrate, and the orthographic projection of the second packaging portion on the base substrate covers a region in the packaging region other than a region where the orthographic projection of the first packaging portion on the base substrate is disposed.

6. The light-emitting device according to claim 1, wherein the light-emitting device further comprises: a reflective layer surrounding the light-emitting unit, an included angle being defined between a reflective surface of the reflective layer and a substrate surface of the base substrate.

7. The light-emitting device according to claim 6, wherein the base substrate is provided with a packaging region, an orthographic projection of the light-emitting unit on the base substrate and an orthographic projection of the reflective layer on the base substrate fall within the packaging region, the orthographic projection of the first packaging portion on the base substrate completely covers the orthographic projection of the light-emitting unit on the base substrate and completely covers the orthographic projection of the reflective layer on the base substrate, and the orthographic projection of the second packaging portion on the base substrate covers a region in the packaging region other than a region where the orthographic projection of the first packaging portion on the base is disposed.

8. The light-emitting device according to claim 7, wherein a second horizontal distance between a boundary of the first packaging portion and a boundary of the reflective surface of the reflective layer is in a range of about 1 micron to 4 microns, the second horizontal distance being a minimum distance between the boundary of the first packaging portion and the boundary of the reflective surface of the reflective layer in a direction parallel to a substrate surface of the base substrate.

9. The light-emitting device according to claim 6, wherein the light-emitting unit comprises a first electrode, a light-emitting layer, and a second electrode which are sequentially superimposed in a direction going distally from the base substrate, the reflective layer being arranged to surround the first electrode.

10. The light-emitting device according to claim 9, wherein the light-emitting device further comprises: a planarization layer, the planarization layer being provided with a groove, and the reflective layer being arranged on a side wall of the groove.

11. The light-emitting device according to claim 1, wherein the light-emitting device further comprises: a defining layer, the defining layer being provided with a light-emitting opening, and the light-emitting unit being disposed in the light-emitting opening.

12. A method for manufacturing a light-emitting device, comprising:
providing a base substrate;
forming a light-emitting unit on the base substrate; and
forming a thin film packaging structure on a side of the light-emitting unit distal from the base substrate, wherein the thin film packaging structure comprises a packaging film layer comprising a first packaging portion and a second packaging portion, and the first packaging portion and the second packaging portion are arranged in the same layer and are in contact with each other,
wherein an orthographic projection of the first packaging portion on the base substrate at least partially overlaps an orthographic projection of the light-emitting unit on the base substrate, an orthographic projection of the second packaging portion on the base substrate at least partially does not overlap the orthographic projection of the light-emitting unit on the base substrate;
a refractive index of the first packaging portion is less than a refractive index of the second packaging portion, and the packaging film layer is configured to enable light emitted by the light-emitting unit to leave from a light emitting surface of the light-emitting device by refraction; and
the thin film packaging structure comprises inorganic layers and organic layers which are alternately superimposed along a direction going distally from the light-emitting unit; and in the thin film packaging structure, a packaging film layer most proximal to the light-emitting unit and a packaging film layer most distal from the light-emitting unit are inorganic layers, and the packaging film layer is an inorganic layer most proximal to the light-emitting unit.

13. The method according to claim 12, wherein forming the thin film packaging structure on the side, distal from the base substrate, of the light-emitting unit comprises:
    forming the first packaging portion on the side, distal from the base substrate, of the light-emitting unit;
    forming the second packaging portion on the side, distal from the base substrate, of the light-emitting unit, wherein the first packaging portion and the second packaging portion form the packaging layer; and
    forming an organic layer on the side, distal from the light-emitting unit, of the packaging film layer.

14. The method according to claim 12, further comprising:
    forming a reflective layer surrounding the light-emitting unit, an included angle being defined between a reflective surface of the reflective layer and a substrate surface of the base substrate.

15. The method according to claim 14, wherein
    forming the light-emitting unit on the base substrate comprises:
        forming a first electrode, a light-emitting layer, and a second electrode which are sequentially superimposed on the base substrate; and
    forming the reflective layer surrounding the light-emitting unit comprises:
        forming a reflective layer surrounding the first electrode.

16. The method according to claim 15, wherein the reflective layer and the first electrode are formed simultaneously.

17. The method according to claim 15, wherein
    before forming the reflective layer surrounding the first electrode, the method further comprises:
        forming a planarization layer on the base substrate, wherein the planarization layer is provided with a groove; and
    forming the reflective layer surrounding the first electrode comprises:
        forming the reflective layer surrounding the first electrode on a side wall of the groove.

18. The method according to claim 12, further comprising:
    forming a defining layer, wherein the defining layer is provided with a light-emitting opening, and the light-emitting unit is disposed in the light-emitting opening.

19. A display device, comprising the light-emitting device as defined in claim 1.

* * * * *